US012690343B2

(12) United States Patent
Murashige

(10) Patent No.: US 12,690,343 B2
(45) Date of Patent: Jul. 21, 2026

(54) DISPLAY DEVICE

(71) Applicant: Sharp Display Technology Corporation, Kameyama City (JP)

(72) Inventor: Shogo Murashige, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 380 days.

(21) Appl. No.: 18/291,906

(22) PCT Filed: Oct. 11, 2021

(86) PCT No.: PCT/JP2021/037610
§ 371 (c)(1),
(2) Date: Jan. 24, 2024

(87) PCT Pub. No.: WO2023/062695
PCT Pub. Date: Apr. 20, 2023

(65) Prior Publication Data
US 2024/0365604 A1 Oct. 31, 2024

(51) Int. Cl.
*H10K 59/12* (2023.01)
*G09F 9/30* (2006.01)
*H10D 30/67* (2025.01)
*H10D 64/62* (2025.01)
*H10D 99/00* (2025.01)
(Continued)

(52) U.S. Cl.
CPC ......... *H10K 59/124* (2023.02); *H10K 59/131* (2023.02); *G09G 3/3233* (2013.01); *G09G 2300/0819* (2013.01); *G09G 2300/0842* (2013.01); *G09G 2300/0861* (2013.01)

(58) Field of Classification Search
CPC ........... H10D 30/6755; H10D 30/6704; H10D 30/6713; H10D 30/6756; G09F 9/30; G09G 3/3233; G09G 2300/0819; G09G 2300/0842; G09G 2300/0861;
(Continued)

(56) References Cited

U.S. PATENT DOCUMENTS 11,980,066 B2 * 5/2024 Na ........................ G06F 3/0412
2014/0117350 A1 5/2014 Koezuka et al.
(Continued)

FOREIGN PATENT DOCUMENTS

JP 6219562 B2 10/2017

*Primary Examiner* — Omar F Mojaddedi
(74) *Attorney, Agent, or Firm* — ScienBiziP, P.C.

(57) ABSTRACT

A display device includes a thin film transistor layer provided on a base substrate layer. The first thin film transistor includes a first semiconductor layer formed of an oxide semiconductor, a first gate insulating film provided on the first semiconductor layer, a first gate electrode provided on the first gate insulating film, a first interlayer insulating film being a silicon oxide film and configured to cover the first gate electrode, and a second interlayer insulating film being a silicon nitride film provided on the first interlayer insulating film. The second interlayer insulating film is formed with a through-hole passing through the second interlayer insulating film and overlapping all of a first channel region of the first semiconductor layer. A metal coating layer is integrally provided on a surface of the first interlayer insulating film exposed from the through-hole and a surface of a peripheral portion of the through-hole.

12 Claims, 19 Drawing Sheets

(51) Int. Cl.

| | | |
|---|---|---|
| *H10K 50/00* | (2023.01) | |
| *H10K 59/00* | (2023.01) | |
| *H10K 59/124* | (2023.01) | |
| *H10K 59/13* | (2023.01) | |
| *H10K 59/131* | (2023.01) | |
| *G09G 3/3233* | (2016.01) | |

(58) Field of Classification Search
CPC .... H10K 50/00; H10K 59/124; H10K 59/131;
H10K 59/00; H10K 59/1213
See application file for complete search history.

(56) References Cited

U.S. PATENT DOCUMENTS

| | | | |
|---|---|---|---|
| 2016/0163868 A1* | 6/2016 | Kobayashi ......... | H10D 30/6704 |
| | | | 257/43 |
| 2018/0076238 A1* | 3/2018 | Lim ................... | H10D 30/6745 |
| 2018/0145094 A1* | 5/2018 | Yan ..................... | H10D 86/423 |
| 2020/0286927 A1* | 9/2020 | Park .................. | H10D 86/0221 |
| 2020/0335530 A1* | 10/2020 | Suzumura ............ | H10D 86/423 |

* cited by examiner

50a(D)

14e

14g

P

14e

14g

Er         Eg         Eb    22i   22f   22g

33

5
4
3
2
1

DISPLAY DEVICE

TECHNICAL FIELD

The disclosure relates to a display device.

BACKGROUND ART

In recent years, as a display device replacing a liquid crystal display device, a self-luminous organic electroluminescence (hereinafter also referred to as "EL") display device using an organic EL element has attracted attention. In the organic EL display device, a plurality of thin film transistors (hereinafter also referred to as "TFTs") are provided for each subpixel being the smallest unit of an image. Here, well known examples of a semiconductor layer constituting the TFT are a semiconductor layer made of poly-silicon having high mobility, a semiconductor layer made of an oxide semiconductor such as In—Ga—Zn—O having a low leakage current, and the like.

For example, PTL 1 discloses a display device that uses transistors with channels formed in an oxide semiconductor layer made of an oxide semiconductor in a pixel portion and a drive circuit portion.

CITATION LIST

Patent Literature

PTL 1: JP 6219562 B

SUMMARY

Technical Problem

In a TFT including a semiconductor layer made of an oxide semiconductor, when a silicon oxide film is used as an interlayer insulating film covering the semiconductor layer, penetration of ambient moisture to the semiconductor layer through an interlayer insulating film, which is a silicon oxide film, may cause a depletion shift in which a threshold voltage of the TFT shifts to a negative side. Furthermore, even when a silicon nitride film having a moisture-proof property is layered on a silicon oxide film and a layered film thereof is used as an interlayer insulating film, penetration of hydrogen originating from the silicon nitride film to the semiconductor layer through the silicon oxide film may cause a depletion shift. Therefore, there is room for improvement.

The disclosure has been made in view of these points, and an object of the disclosure is to suppress a depletion shift due to diffusion of moisture and hydrogen.

Solution to Problem

In order to achieve the above object, a display device according to the disclosure includes a base substrate layer, and a thin film transistor layer provided on the base substrate layer, in which a first thin film transistor including a first semiconductor layer formed of an oxide semiconductor is provided for a subpixel in the thin film transistor layer, the first thin film transistor includes the first semiconductor layer including a first conductor region and a second conductor region defined separately from each other and a first channel region defined between the first conductor region and the second conductor region, a first gate insulating film provided on the first semiconductor layer, a first gate electrode provided on the first gate insulating film and configured to control conduction between the first conductor region and the second conductor region, a first interlayer insulating film being a silicon oxide film and configured to cover the first gate electrode, a second interlayer insulating film being a silicon nitride film provided on the first interlayer insulating film, and a first terminal electrode and a second terminal electrode provided on the second interlayer insulating film separated from each other and electrically connected to the first conductor region and the second conductor region through a first contact hole and a second contact hole, respectively, formed in the first interlayer insulating film and the second interlayer insulating film, the second interlayer insulating film is formed with a through-hole passing through the second interlayer insulating film and overlapping all of the first channel region, and a metal coating layer is integrally provided on a surface of the first interlayer insulating film exposed from the through-hole and a surface of a peripheral portion of the through-hole.

Advantageous Effects of Disclosure

According to the disclosure, a depletion shift due to diffusion of moisture and hydrogen can be suppressed.

DESCRIPTION OF EMBODIMENTS

Embodiments of a technique according to the disclosure will be described below in detail with reference to the drawings. Note that the technique according to the disclosure is not limited to the embodiments to be described below.

First Embodiment

Figure 1:
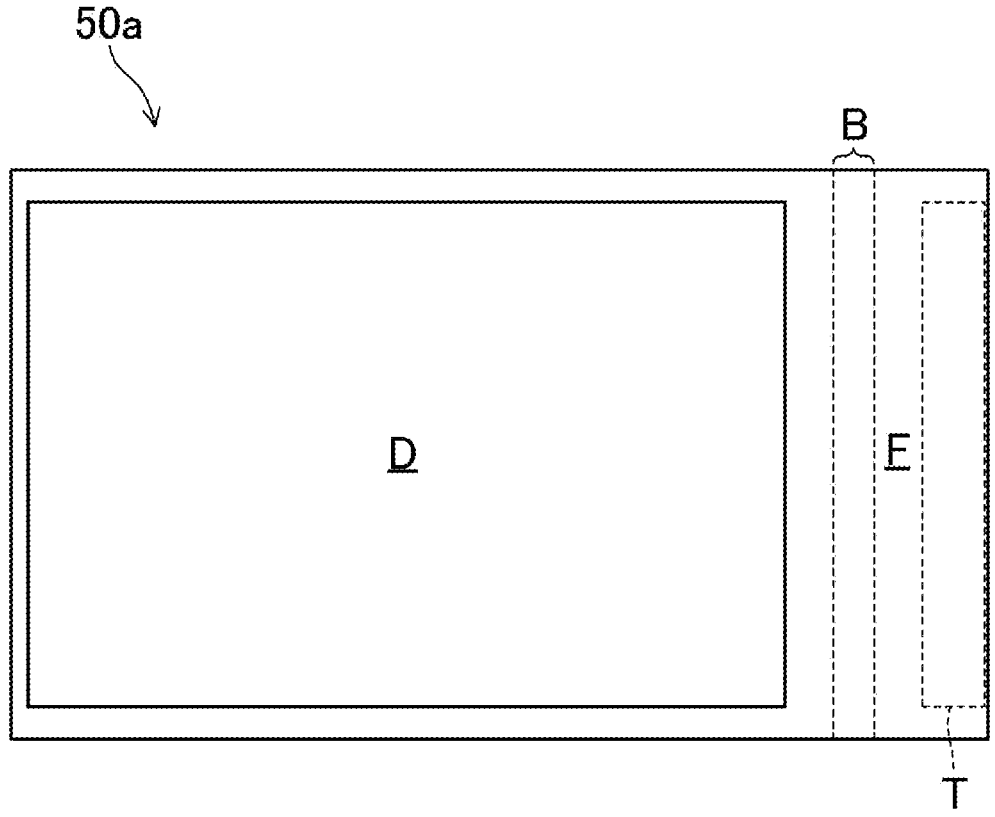
FIG. 1 is a plan view illustrating a schematic configuration of an organic EL display device according to a first embodiment of the disclosure.
Figure 2:
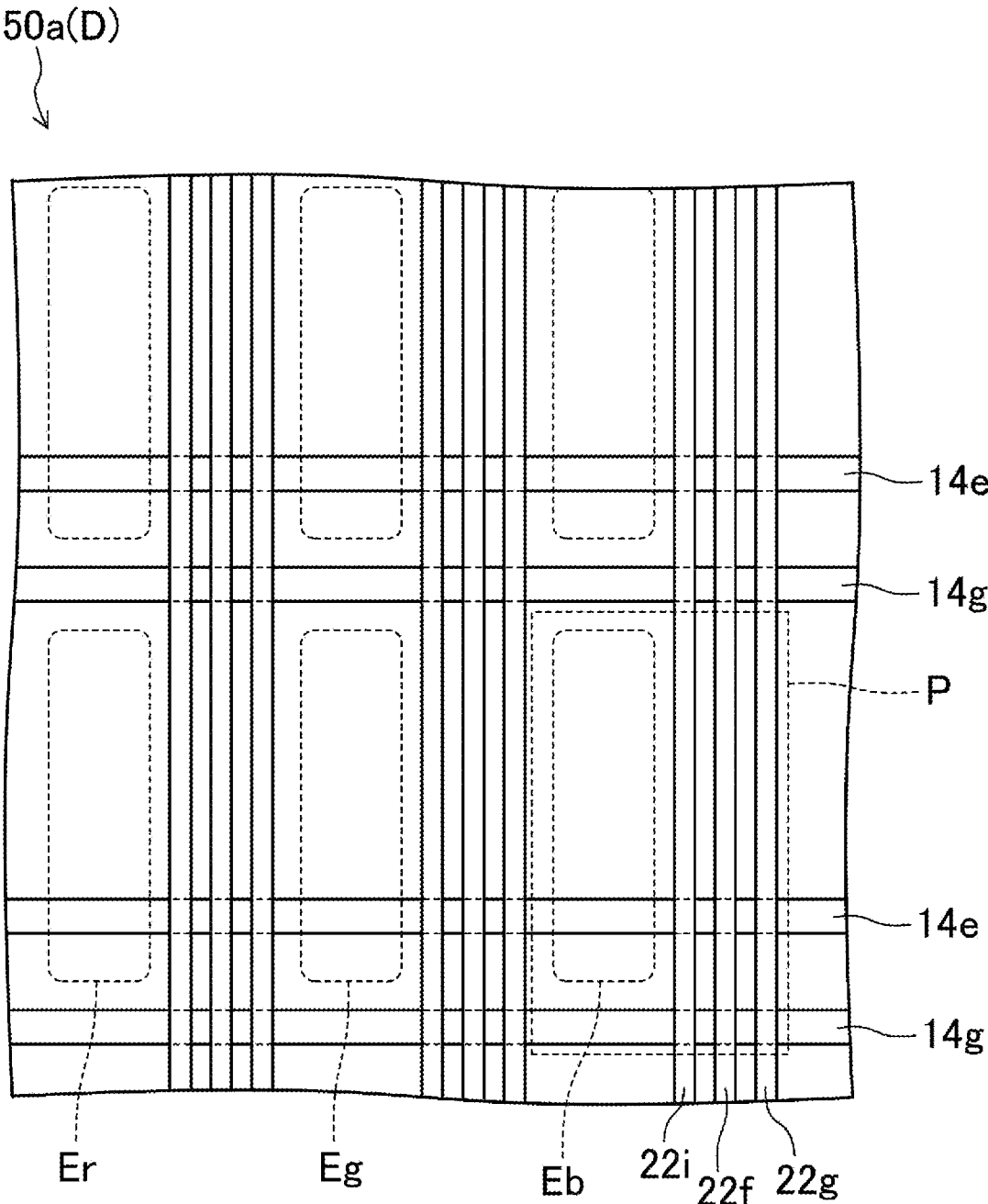
FIG. 2 is a plan view of a display region of the organic EL display device according to the first embodiment of the disclosure.
Figure 3:
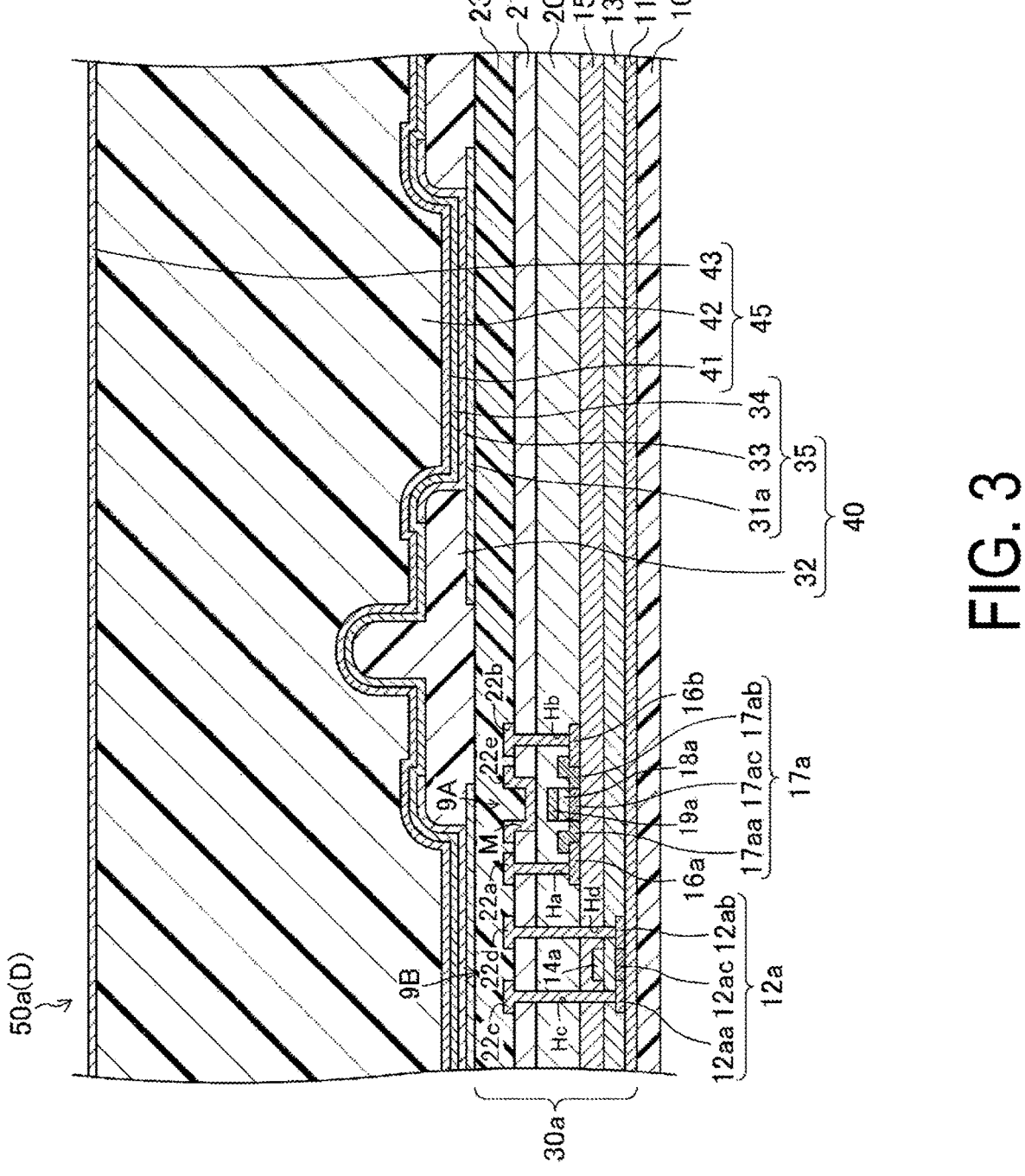
FIG. 3 is a cross-sectional view of the display region of the organic EL display device according to the first embodiment of the disclosure.
Figure 4:
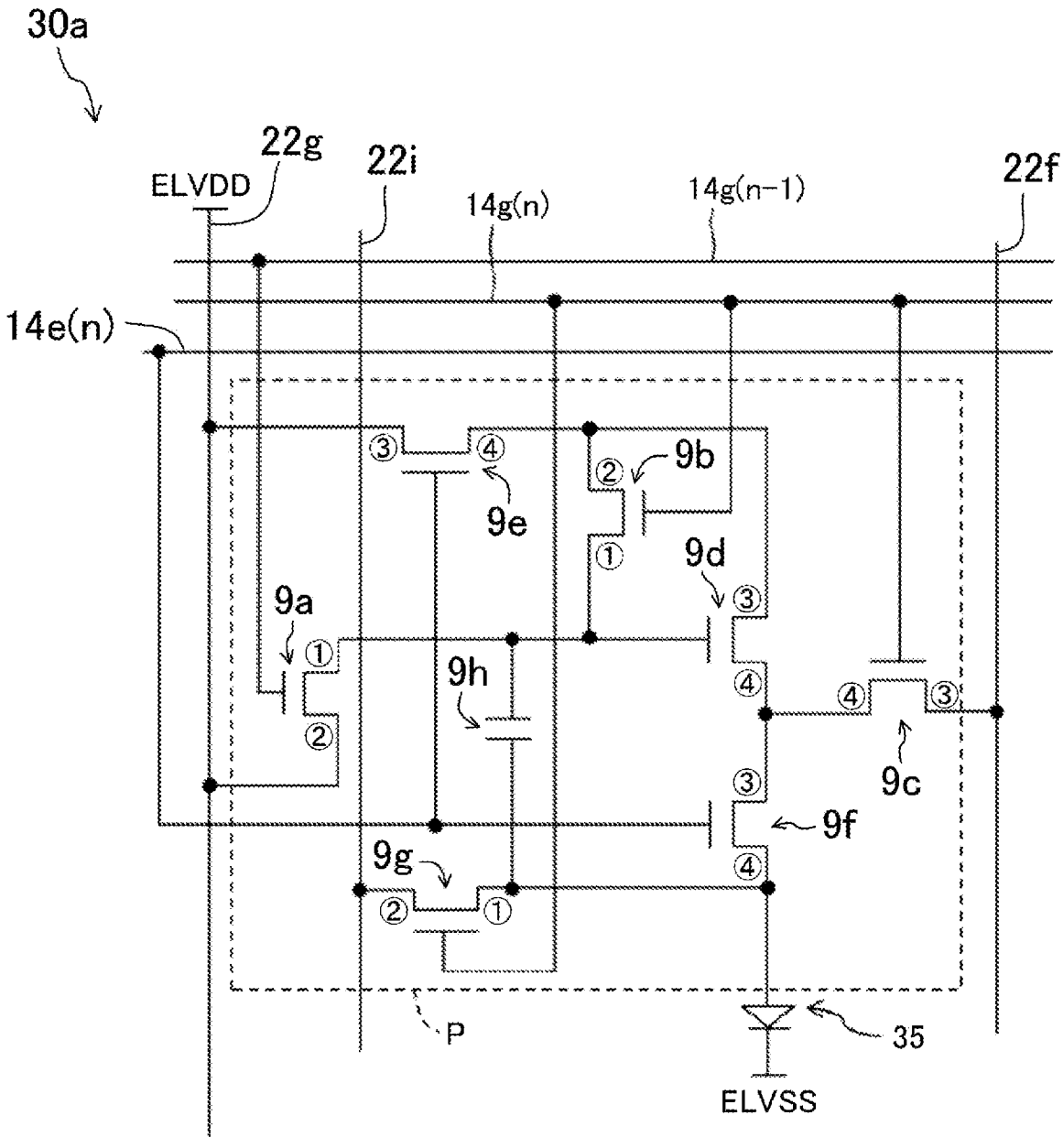
FIG. 4 is an equivalent circuit diagram of a thin film transistor layer included in the organic EL display device according to the first embodiment of the disclosure.
Figure 5:
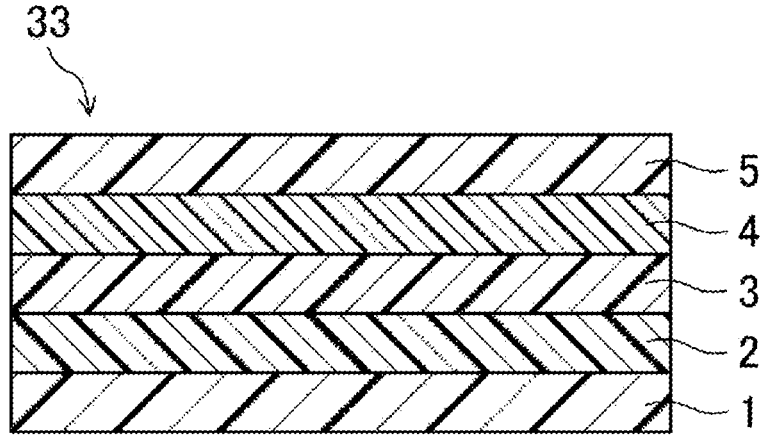
FIG. 5 is a cross-sectional view illustrating an organic EL layer included in the organic EL display device according to the first embodiment of the disclosure.

FIG. 1 to FIG. 11 illustrate a first embodiment of a display device according to the disclosure. Note that, in each of the following embodiments, an organic EL display device including an organic EL element layer is exemplified as a display device including a light-emitting element layer. Here, FIG. 1 is a plan view illustrating a schematic configuration of an organic EL display device 50a according to the present embodiment. FIG. 2 and FIG. 3 are a plan view and a cross-sectional view, respectively, of a display region D in the organic EL display device 50a. FIG. 4 is an equivalent circuit diagram of a thin film transistor layer 30a included in the organic EL display device 50a. Additionally, FIG. 5 is a cross-sectional view illustrating an organic EL layer 33 included in the organic EL display device 50a.

As illustrated in FIG. 1, the organic EL display device 50a includes, for example, the display region D provided in a rectangular shape and configured to display an image, and a frame region F provided in a periphery of the display region D. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

As illustrated in FIG. 2, a plurality of subpixels P are arrayed in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D.

A terminal portion T is provided at the right end portion of the frame region F in FIG. 1. Further, as illustrated in FIG. 1, in the frame region F, a bendable bending portion B that can bend 180° (in a U-shape) with the vertical direction in the drawing as a bending axis is provided between the display region D and the terminal portion T to extend in one direction (the vertical direction in the drawing).

As illustrated in FIG. 3, the organic EL display device 50a includes a resin substrate layer 10 provided as a base substrate layer, a TFT layer 30a provided on the resin substrate layer 10, an organic EL element layer 40 provided as a light-emitting element layer on the TFT layer 30a, and a sealing film 45 provided to cover the organic EL element layer 40.

The resin substrate layer 10 is formed, for example, of a polyimide resin.

As illustrated in FIG. 3, the TFT layer 30a includes a base coat film 11 provided on the resin substrate layer 10, three first TFTs 9A, four second TFTs 9B, and one capacitor 9h (see FIG. 4) provided on the base coat film 11 for each subpixel P, and a flattening film 23 provided on all of the first TFTs 9A, the second TFTs 9B, and the capacitors 9h. Here, as illustrated in FIG. 2, in the TFT layer 30a, a plurality of gate lines 14g are provided to extend parallel to each other in the horizontal direction in the drawing. As illustrated in FIG. 2, in the TFT layer 30a, a plurality of light emission control lines 14e are provided to extend parallel to each other in the horizontal direction in the drawing. As illustrated in FIG. 2, in the TFT layer 30a, a plurality of source lines 22f are provided to extend parallel to each other in the vertical direction in the drawing. As illustrated in FIG. 2, in the TFT layer 30a, a plurality of power source lines 22g are provided to extend parallel to each other in the vertical direction in the drawing. As illustrated in FIG. 2, in the TFT layer 30a, a plurality of initialization signal lines 22i are provided to extend parallel to each other in the vertical direction in the drawing. Note that, as illustrated in FIG. 2, each of the source lines 22f is provided adjacent to each of the power source lines 22g and each of the initialization signal lines 22i. Here, in the TFT layer 30a, as illustrated in FIG. 3, the base coat film 11, a second gate insulating film 13, a third interlayer insulating film 15, a first interlayer insulating film 20, a second interlayer insulating film 21, and the flattening film 23 are sequentially layered on the resin substrate layer 10. The gate lines 14g and the light emission control lines 14e are provided on the second gate insulating film 13, and the source lines 22f, the power source lines 22g, and the initialization signal lines 22i are provided on the second interlayer insulating film 21.

As illustrated in FIG. 3, the first TFT 9A includes a first semiconductor layer 17a provided on the third interlayer insulating film 15, a first conductive layer 16a and a second conductive layer 16b provided closer to the resin substrate layer 10 than a first conductor region 17aa and a second conductor region 17ab, which will be described later, of the first semiconductor layer 17a, respectively, a first gate insulating film 18a provided on a first channel region 17ac, which will be described later, of the first semiconductor layer 17a, a first gate electrode 19a provided on the first gate insulating film 18a, the first interlayer insulating film 20 provided to cover the first gate electrode 19a, the second interlayer insulating film 21 provided on the first interlayer insulating film 20, and a first terminal electrode 22a and a second terminal electrode 22b provided on the second interlayer insulating film 21 so as to be separated from each other. Here, each of the base coat film 11, the second gate insulating film 13, the third interlayer insulating film 15, and the first gate insulating film 18*a* is composed of, for example, a single-layer film or a layered film of an inorganic insulating film such as silicon nitride, silicon oxide, or silicon oxynitride. Note that at least the third interlayer insulating film 15 and the first gate insulating film 18*a* on sides of the first semiconductor layer 17*a* are composed of, for example, silicon oxide films, respectively.

The first semiconductor layer 17*a* is formed of, for example, an In—Ga—Zn—O based oxide semiconductor, and includes, as illustrated in FIG. 3, the first conductor region 17*aa* and the second conductor region 17*ab* defined to be separated from each other, and the first channel region 17*ac* defined between the first conductor region 17*aa* and the second conductor region 17*ab*. Here, the In—Ga—Zn—O based semiconductor is ternary oxide of indium (In), gallium (Ga), and zinc (Zn), and a ratio (a composition ratio) of each of In, Ga, and Zn is not particularly limited to a specific value. The In—Ga—Zn—O based semiconductor may be an amorphous semiconductor or may be a crystalline semiconductor. Note that a crystalline In—Ga—Zn—O based semiconductor in which a c-axis is oriented substantially perpendicular to a layer surface is preferable as the crystalline In—Ga—Zn—O based semiconductor. In place of the In—Ga—Zn—O based semiconductor, another oxide semiconductor may be included. Examples of other oxide semiconductors may include an In—Sn—Zn—O based semiconductor (for example, $In_2O_3$—$SnO_2$—$ZnO$; InSnZnO). The In—Sn—Zn—O based semiconductor is ternary oxide of indium (In), tin (Sn), and zinc (Zn). Alternatively, examples of other oxide semiconductors may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3$ $(ZnO)_5$, magnesium zinc oxide $(Mg_xZn_{1-x}O)$, and cadmium zinc oxide $(Cd_xZn_{1-x}O)$. Note that as the Zn—O based semiconductor, a semiconductor in a non-crystalline (amorphous) state of ZnO to which one kind or a plurality of kinds of impurity elements among group 1 elements, group 13 elements, group 14 elements, group 15 elements, group 17 elements, and the like are added, a polycrystalline state, or a microcrystalline state in which the non-crystalline state and the polycrystalline state are mixed, or a semiconductor to which no impurity element is added can be used.

As illustrated in FIG. 3, the first conductive layer 16*a* and the second conductive layer 16*b* are provided so as to be in contact with the first conductor region 17*aa* and the second conductor region 17*ab* at both end portions of the first semiconductor layer 17*a* on a side of the resin substrate layer 10, respectively. Here, the first conductive layer 16*a* and the second conductive layer 16*b* are formed of, for example, a metal film such as a molybdenum film.

The first gate insulating film 18*a* is provided so as to overlap the first gate electrode 19*a*, as illustrated in FIG. 3.

As illustrated in FIG. 3, the first gate electrode 19*a* is provided so as to overlap the first channel region 17*ac* of the first semiconductor layer 17*a* with the first gate insulating film 18*a* interposed therebetween, and is configured to control conduction between the first conductor region 17*aa* and the second conductor region 17*ab* of the first semiconductor layer 17*a*.

As illustrated in FIG. 3, the first interlayer insulating film 20 is provided so as to cover part of the first semiconductor layer 17*a* not covered by the first gate electrode 19*a*, as well as parts of the first conductive layer 16*a* and the second conductive layer 16*b*. Here, the first interlayer insulating film 20 is constituted of, for example, an inorganic insulating film such as a silicon oxide film.

The second interlayer insulating film 21 is constituted of, for example, an inorganic insulating film such as a silicon nitride film, and has a moisture-proof property. Further, as illustrated in FIG. 3, the second interlayer insulating film 21 is provided with a through-hole M passing through the second interlayer insulating film 21 so as to overlap all of the first channel region 17*ac*. Here, a surface of the first interlayer insulating film 20 exposed from the through-hole M and a surface of a peripheral portion of the through-hole M are integrally covered with a metal coating layer 22*e*, as illustrated in FIG. 3. Note that the metal coating layer 22*e* is formed of the same material and in the same layer as the source line 22*f*, the power source line 22*g*, the initialization signal line 22*i*, the first terminal electrode 22*a*, and the second terminal electrode 22*b*. Further, the metal coating layer 22*e* is electrically floating.

As illustrated in FIG. 3, the first terminal electrode 22*a* and the second terminal electrode 22*b* are electrically connected to the first conductor region 17*aa* and the second conductor region 17*ab* through a first contact hole Ha and a second contact hole Hb, respectively, formed in a layered film of the first interlayer insulating film 20 and the second interlayer insulating film 21. Here, as illustrated in FIG. 3, the first contact hole Ha and the second contact hole Hb are provided so as to overlap the first conductive layer 16*a* in contact with the first conductor region 17*aa* and the second conductive layer 16*b* in contact with the second conductor region 17*ab*, respectively, and thus a bottom contact structure is configured.

Here, as illustrated in FIG. 3, the second TFT 9B includes a second semiconductor layer 12*a* provided on the base coat film 11, the second gate insulating film 13 provided on the second semiconductor layer 12*a*, a second gate electrode 14*a* provided on the second gate insulating film 13, the third interlayer insulating film 15, the first interlayer insulating film 20, and the second interlayer insulating film 21 sequentially provided so as to cover the second gate electrode 14*a*, and a third terminal electrode 22*c* and a fourth terminal electrode 22*d* provided on the second interlayer insulating film 21 so as to be separated from each other.

The second semiconductor layer 12*a* is formed of, for example, polysilicon such as low temperature polysilicon (LTPS), and as illustrated in FIG. 3, includes a third conductor region 12*aa* and a fourth conductor region 12*ab* defined to be separated from each other, and a second channel region 12*ac* defined between the third conductor region 12*aa* and the fourth conductor region 12*ab*.

As illustrated in FIG. 3, the second gate electrode 14*a* is provided so as to overlap the second channel region 12*ac* of the second semiconductor layer 12*a*, and is configured to control conduction between the third conductor region 12*aa* and the fourth conductor region 12*ab* of the second semiconductor layer 12*a*.

As illustrated in FIG. 3, the third terminal electrode 22*c* and the fourth terminal electrode 22*d* are electrically connected to the third conductor region 12*aa* and the fourth conductor region 12*ab* of the second semiconductor layer 12a through a third contact hole Hc and a fourth contact hole Hd, respectively, formed in a layered film of the second gate insulating film 13, the third interlayer insulating film 15, the first interlayer insulating film 20, and the second interlayer insulating film 21.

In the present embodiment, as the three first TFTs 9A, each including the first semiconductor layer 17a formed of an oxide semiconductor, an initialization TFT 9a, a compensation TFT 9b, and an anode discharge TFT 9g, which will be described later, are exemplified, and as the four second TFTs 9B, each including the second semiconductor layer 12a formed of polysilicon, a write TFT 9c, a drive TFT 9d, a power supply TFT 9e, and a light-emission control TFT 9f, which will be described later, are exemplified (see FIG. 4). Note that, in the equivalent circuit diagram in FIG. 4, the first terminal electrode 22a and the second terminal electrode 22b of each of the TFTs 9a, 9b, and 9g are indicated by circled numbers 1 and 2, respectively, and the third terminal electrode 22c and the fourth terminal electrode 22d of each of the TFTs 9c, 9d, 9e, and 9f are indicated by circled numbers 3 and 4, respectively. In the equivalent circuit diagram in FIG. 4, the pixel circuit of the subpixel P in the n-th row and the m-th column is illustrated, but a part of the pixel circuit of the subpixel P in the (n−1)-th row and the m-th column is also included.

As illustrated in FIG. 4, in each subpixel P, a gate electrode of the initialization TFT 9a is electrically connected to a gate line 14g(n−1) of the previous stage ((n−1)-th stage), a first terminal electrode of the initialization TFT 9a is electrically connected to a lower conductive layer of the capacitor 9h, which will be described later, and a gate electrode of the drive TFT 9d, and a second terminal electrode of the initialization TFT 9a is electrically connected to the power source line 22g.

As illustrated in FIG. 4, in each subpixel P, a gate electrode of the compensation TFT 9b is electrically connected to a gate line 14g(n) of the own stage (n-th stage), a first terminal electrode of the compensation TFT 9b is electrically connected to the gate electrode of the drive TFT 9d, and a second terminal electrode of the compensation TFT 9b is electrically connected to a third terminal electrode of the drive TFT 9d.

As illustrated in FIG. 4, in each subpixel P, a gate electrode of the write TFT 9c is electrically connected to the gate line 14g(n) of the own stage (n-th stage), a third terminal electrode of the write TFT 9c is electrically connected to a corresponding source line 22f, and a fourth terminal electrode of the write TFT 9c is electrically connected to a fourth terminal electrode of the drive TFT 9d.

As illustrated in FIG. 4, in each subpixel P, the gate electrode of the drive TFT 9d is electrically connected to each of first terminal electrodes of the initialization TFT 9a and the compensation TFT 9b, the third terminal electrode of the drive TFT 9d is electrically connected to the second terminal electrode of the compensation TFT 9b and fourth terminal electrodes of the power supply TFT 9e, and the fourth terminal electrode of the drive TFT 9d is electrically connected to the fourth terminal electrode of the write TFT 9c and a third terminal electrode of the light-emission control TFT 9f. Here, the drive TFT 9d is configured to control the current of the organic EL element 35.

As illustrated in FIG. 4, in each subpixel P, a gate electrode of the power supply TFT 9e is electrically connected to a light emission control line 14e of the own stage (n-th stage), a third terminal electrode of the power supply TFT 9e is electrically connected to the power source line

22g, and the fourth terminal electrode of the power supply TFT 9e is electrically connected to the third terminal electrode of the drive TFT 9d.

As illustrated in FIG. 4, in each subpixel P, a gate electrode of the light-emission control TFT 9f is electrically connected to the light emission control line 14e of the own stage (n-th stage), the third terminal electrode of the light-emission control TFT 9f is electrically connected to the fourth terminal electrode of the drive TFT 9d, and a fourth terminal electrode of the light-emission control TFT 9f is electrically connected to a first electrode 31a of the organic EL element 35, which will be described later.

As illustrated in FIG. 4, in each subpixel P, a gate electrode of the anode discharge TFT 9g is electrically connected to the gate line 14g(n) of the own stage (n-th stage), a first terminal electrode of the anode discharge TFT 9g is electrically connected to the first electrode 31a of the organic EL element 35, and a second terminal electrode of the anode discharge TFT 9g is electrically connected to the initialization signal line 22i.

The capacitor 9h includes, for example, the lower conductive layer (not illustrated) formed of the same material and in the same layer as the second gate electrode 14a, the third interlayer insulating film 15 provided to cover the lower conductive layer, and an upper conductive layer (not illustrated) provided on the third interlayer insulating film 15 to overlap the lower conductive layer and formed of the same material and in the same layer as the first conductive layer 16a and the second conductive layer 16b. As illustrated in FIG. 4, in each subpixel P, the lower conductive layer of the capacitor 9h is electrically connected to the gate electrode of the drive TFT 9d and the first terminal electrodes of the initialization TFT 9a and the compensation TFT 9b, the upper conductive layer of the capacitor 9h is electrically connected to the first terminal electrode of the anode discharge TFT 9g, the fourth terminal electrode of the light-emission control TFT 9f, and the first electrode 31a of the organic EL element 35.

The flattening film 23 has a flat surface in the display region D, and is made of, for example, an organic resin material such as a polyimide resin or an acrylic resin, or a polysiloxane-based spin on glass (SOG) material.

As illustrated in FIG. 3, the organic EL element layer 40 includes a plurality of first electrodes 31a, a common edge cover 32, a plurality of organic EL layers 33, and a common second electrode 34, which are sequentially layered on the TFT layer 30a, corresponding to the plurality of subpixels P. Here, as illustrated in FIG. 3, the organic EL element 35 is constituted of the first electrode 31a, the organic EL layer 33, and the second electrode 34 sequentially layered on the flattening film 23 of the TFT layer 30a.

The first electrode 31a is electrically connected to the fourth terminal electrode of the light-emission control TFT 9f of each of the subpixels P, via a contact hole formed in the flattening film 23. Additionally, the first electrode 31a has a function to inject a hole (positive hole) into the organic EL layer 33. Additionally, the first electrode 31a is preferably formed of a material having a high work function to improve hole injection efficiency into the organic EL layer 33. Here, examples of a material constituting the first electrode 31a include a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn) and the like. Examples of the material of the first electrode 31a also include an alloy such as astatine (At)/ astatine oxide ($AtO_2$). Further, the material constituting the first electrode 31a may be, for example, an electrically conductive oxide such as tin oxide (SnO), zinc oxide (ZnO), indium tin oxide (ITO), indium zinc oxide (IZO) and the like. Additionally, the first electrode 31a may be formed by layering a plurality of layers including any of the materials described above. Note that examples of compound materials having a high work function include indium tin oxide (ITO) and indium zinc oxide (IZO).

As illustrated in FIG. 3, the edge cover 32 is provided in a lattice pattern, and covers peripheral end portions of the first electrodes 31a. Here, the edge cover 32 is made of, for example, an organic resin material such as a polyimide resin or an acrylic resin, or a polysiloxane-based SOG material.

The organic EL layer 33 is provided as a light-emitting function layer and includes a hole injection layer 1, a hole transport layer 2, a light-emitting layer 3, an electron transport layer 4, and an electron injection layer 5 that are sequentially layered on the first electrode 31a, as illustrated in FIG. 5.

The hole injection layer 1 is also referred to as an anode electrode buffer layer, and has a function to reduce an energy level difference between the first electrode 31a and the organic EL layer 33 and to improve hole injection efficiency from the first electrode 31a into the organic EL layer 33. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function to improve hole transport efficiency from the first electrode 31a to the organic EL layer 33. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where, when a voltage is applied by the first electrode 31a and the second electrode 34, a positive hole and an electron are injected from the first electrode 31a and the second electrode 34, respectively, and the positive hole and the electron are recombined. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of efficiently transporting electrons to the light-emitting layer 3. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33 to thereby improve the efficiency of electron injection into the organic EL layer 33 from the second electrode 34, and this function allows the drive voltage of the organic EL element 35 to be reduced. Note that the electron injection layer 5 is also referred to as a cathode electrode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 3, the second electrode 34 is provided in common to all the subpixels P to cover each of the organic EL layer 33 and the edge cover 32. Further, the second electrode 34 functions to inject electrons into the organic EL layer 33. Further, the second electrode 34 is preferably formed of a material having a low work function to improve the efficiency of electron injection into the organic EL layer 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 45 is provided to cover the second electrode 34, and includes a first inorganic sealing film 41, an organic sealing film 42, and a second inorganic sealing film 43 sequentially layered on the second electrode 34, and has a function to protect the organic EL layer 33 of the organic EL element 35 from moisture and oxygen.

The first inorganic sealing film 41 and the second inorganic sealing film 43 are constituted of, for example, an inorganic insulating film such as a silicon nitride film, a silicon oxide film, or a silicon oxynitride film.

The organic sealing film 42 is made of, for example, an organic resin material such as an acrylic resin, an epoxy resin, a silicone resin, a polyurea resin, a parylene resin, a polyimide resin, a polyamide resin, or the like.

In the organic EL display device 50*a* having the configuration described above, in each subpixel P, when the light emission control line 14*e* is first selected and deactivated, the organic EL element 35 is brought into a non-light emission state. In the non-light emission state, the gate line 14*g*(*n*−1) of the previous stage is selected, and a gate signal is input to the initialization TFT 9*a* via the gate line 14*g*(*n*−1), so that the initialization TFT 9*a* is brought into an on state, thereby applying a high power supply voltage ELVDD of the power source line 22*g* to the capacitor 9*h* and bringing the drive TFT 9*d* into an on state. Thereby, the charge of the capacitor 9*h* is discharged to initialize the voltage applied to the gate electrode of the drive TFT 9*d*. Next, the gate line 14*g*(*n*) of the own stage is selected and activated, so that the compensation TFT 9*b* and the write TFT 9*c* are brought into an on state. Thus, a predetermined voltage corresponding to a source signal transmitted via the corresponding source line 22*f* is written to the capacitor 9*h* via the drive TFT 9*d* in the diode-connected state, and the anode discharge TFT 9*g* is brought into an on state, so that an initialization signal is applied to the first electrode 31*a* of the organic EL element 35 via the initialization signal line 22*i* to reset the charge accumulated in the first electrode 31*a*. Thereafter, the light emission control line 14*e* is selected, and the power supply TFT 9*e* and the light-emission control TFT 9*f* are brought into an on state, so that a drive current corresponding to the voltage applied to the gate electrode of the drive TFT 9*d* is supplied to the organic EL element 35 from the power source line 22*g*. Thus, in the organic EL display device 50*a*, the organic EL element 35 in each subpixel P emits light with luminance corresponding to the drive current, and an image is displayed.

Figure 6:
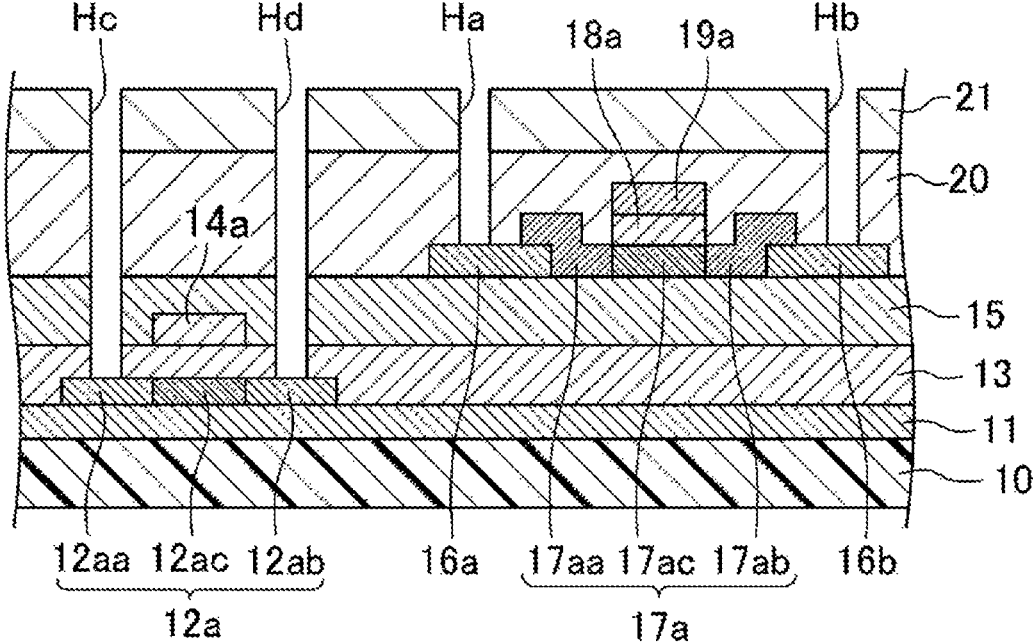
FIG. 6 is a first cross-sectional view illustrating a method for manufacturing the organic EL display device according to the first embodiment of the disclosure.
Figure 7:
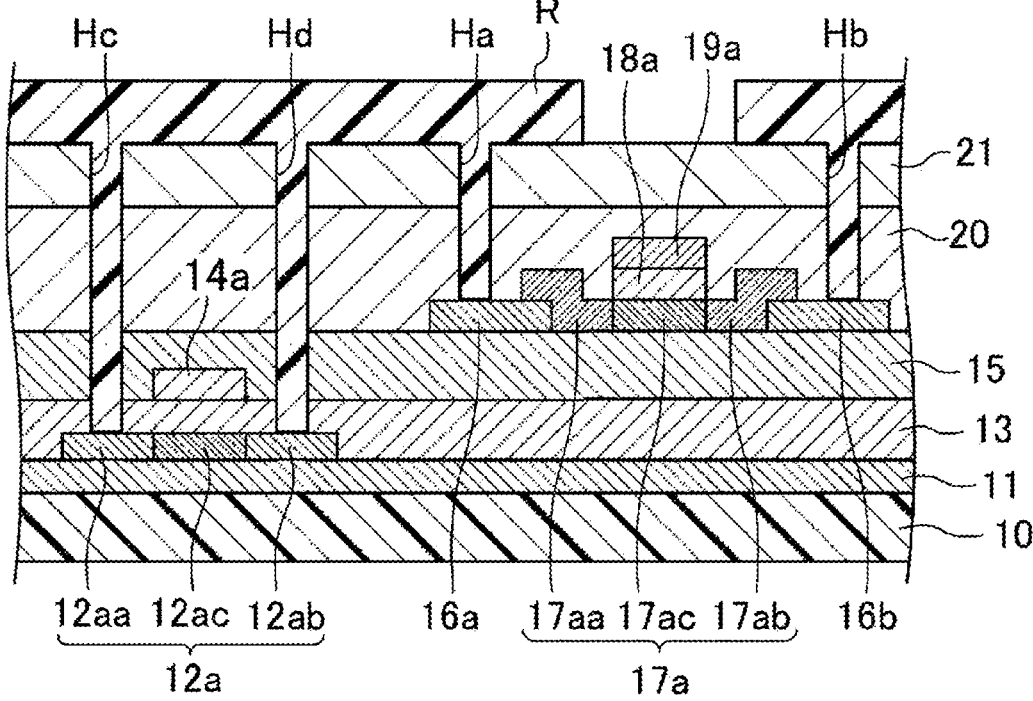
FIG. 7 is a second cross-sectional view illustrating the method for manufacturing the organic EL display device according to the first embodiment of the disclosure.
Figure 8:
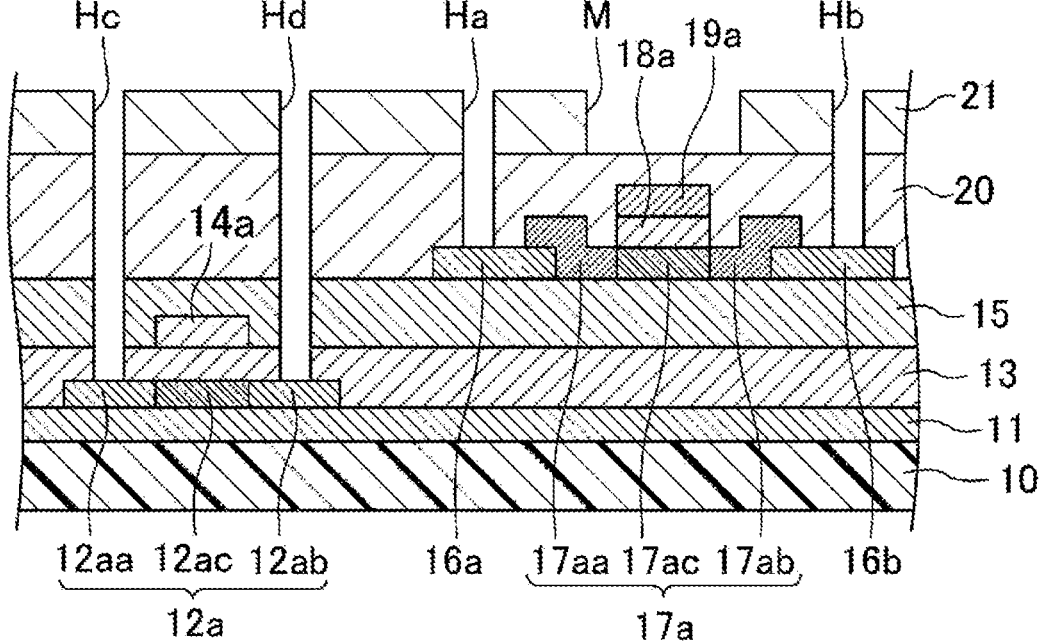
FIG. 8 is a third cross-sectional view illustrating the method for manufacturing the organic EL display device according to the first embodiment of the disclosure.

Next, a method for manufacturing the organic EL display device 50*a* according to the present embodiment will be described. Note that the method for manufacturing the organic EL display device 50*a* includes a TFT layer forming step, an organic EL element layer forming step, and a sealing film forming step. Here, FIG. 6, FIG. 7, and FIG. 8 are first, second, and third cross-sectional views illustrating the method for manufacturing the organic EL display device 50*a*.

TFT Layer Forming Step

First, for example, a silicon nitride film (having a thickness of about 50 nm) and a silicon oxide film (having a thickness of about 250 nm) are sequentially formed on the resin substrate layer 10 formed on a glass substrate by, for example, plasma chemical vapor deposition (CVD), to form the base coat film 11.

Subsequently, an amorphous silicon film (having a thickness of about 50 nm) is formed on a substrate surface on which the base coat film 11 is formed by, for example, plasma CVD, and the amorphous silicon film is crystallized by laser annealing or the like to form a polysilicon film. Thereafter, the polysilicon film is patterned to form second semiconductor layers 12*a* and the like.

Further, a silicon oxide film (having a thickness of about 100 nm) is formed on the substrate surface on which the second semiconductor layers 12*a* and the like are formed by, for example, plasma CVD to form the second gate insulating film 13. Thereafter, a metal film such as a molybdenum film (having a thickness of about 200 nm) is formed by, for example, sputtering. Thereafter, the metal film is patterned to form the second gate electrodes 14*a*, the gate lines 14*g*, the light emission control lines 14*e*, and the like.

Subsequently, by doping the second semiconductor layers 12*a* with impurity ions such as phosphorus using the second gate electrodes 14*a* as a mask, in each of the second semiconductor layers 12*a*, the third conductor region 12*aa*, the fourth conductor region 12*ab*, and the second channel region 12*ac* are formed.

Further, on the substrate surface on which the third conductor regions 12*aa* and the like are formed in the second semiconductor layers 12*a*, the third interlayer insulating film 15 is formed by forming a single-layer film that is a silicon oxide film (having a thickness of about 150 nm) or a layered film in which a silicon nitride film (having a thickness of about 150 nm) and a silicon oxide film (having a thickness of about 50 nm) are sequentially layered by, for example, plasma CVD. Thereafter, a metal film such as a molybdenum film (having a thickness of about 200 nm) is formed by, for example, sputtering. Thereafter, the metal film is patterned to form the first conductive layers 16*a*, the second conductive layers 16*b*, and the like.

Subsequently, on the substrate surface on which the first conductive layers 16*a* and the like are formed, an oxide semiconductor film (having a thickness of about 30 nm) such as InGaZnO$_4$ is formed by, for example, sputtering, and then the oxide semiconductor film is patterned to form the first semiconductor layers 17*a* and the like.

Further, on the substrate surface on which the first semiconductor layers 17*a* and the like are formed, a silicon oxide film (having a thickness of about 100 nm) and the like are formed by, for example, plasma CVD, and then a metal film such as a single-layer film that is a molybdenum film (having a thickness of about 200 nm), a layered film in which an aluminum film (having a thickness of about 300 nm) and a titanium film (having a thickness of about 50 nm) are sequentially layered, or a layered film in which a titanium film (having a thickness of about 50 nm), an aluminum film (having a thickness of about 300 nm), and a titanium film (having a thickness of about 50 nm) are sequentially layered is formed by sputtering. Then, by patterning a layered film thereof, the first gate insulating films 18*a*, the first gate electrodes 19*a*, and the like are formed.

Subsequently, on the substrate surface on which the first gate electrodes 19*a* and the like are formed, a silicon oxide film (having a thickness of about 400 nm) and a silicon nitride film (having a thickness of about 200 nm) are sequentially formed, by, for example, plasma CVD, thereby forming the first interlayer insulating film 20 and the second interlayer insulating film 21. Thereafter, by appropriately patterning the second gate insulating film 13, the third interlayer insulating film 15, the first interlayer insulating film 20, and the second interlayer insulating film 21, the first contact holes Ha, the second contact holes Hb, the third contact holes Hc, the fourth contact holes Hd, and the like are formed as illustrated in FIG. 6.

Further, as illustrated in FIG. 7, a resist pattern R is formed on the surface of the substrate in which the first contact holes Ha and the like are formed, and then the second interlayer insulating film 21 exposed from the resist pattern R is etched to form the through-holes M in the second interlayer insulating film 21 as illustrated in FIG. 8.

Thereafter, on the surface of the substrate in which the through-holes M are formed in the second interlayer insulating film 21, a titanium film (having a thickness of about 50 nm), an aluminum film (having a thickness of about 600 nm), a titanium film (having a thickness of about 50 nm), and the like are sequentially formed by, for example, sputtering, and then, a metal layered film thereof is patterned to form the first terminal electrodes 22*a*, the second terminal electrodes 22*b*, the third terminal electrodes 22*c*, the fourth terminal electrodes 22*d*, the metal coating layers 22*e*, the source lines 22*f*, the power source lines 22*g*, the initialization signal lines 22*i*, and the like.

Finally, a polyimide-based photosensitive resin film (having a thickness of about 2 μm) is applied to the substrate surface on which the first terminal electrodes 22*a* and the like are formed by, for example, spin coating or a slit coating, and then pre-baking, exposing, developing, and post-baking are performed on the applied film to form the flattening film 23.

As described above, the TFT layer 30*a* can be formed.

Organic EL Element Layer Forming Step

The organic EL element layer 40 is formed by forming the first electrodes 31*a*, the edge cover 32, the organic EL layers 33 (the hole injection layers 1, the hole transport layers 2, the light-emitting layers 3, the electron transport layers 4, and the electron injection layers 5), and the second electrode 34 on the flattening film 23 of the TFT layer 30*a* that has been formed in the TFT layer forming step, by using a known method.

Sealing Film Forming Step

First, an inorganic insulating film such as a silicon nitride film, a silicon oxide film, or a silicon oxynitride film is formed by plasma CVD on a substrate surface formed with the organic EL element layer 40 formed in the organic EL element layer forming step by using a mask to form the first inorganic sealing film 41.

Next, on the substrate surface formed with the first inorganic sealing film 41, a film made of an organic resin material such as acrylic resin is formed by, for example, using an ink-jet method to form the organic sealing film 42.

Thereafter, an inorganic insulating film such as a silicon nitride film, a silicon oxide film, or a silicon oxynitride film is formed by plasma CVD on the substrate surface formed with the organic sealing film 42 by using a mask to form the second inorganic sealing film 43, thereby forming the sealing film 45.

Finally, after a protective sheet (not illustrated) is attached to the substrate surface on which the sealing film 45 is formed, the glass substrate is peeled off from the lower face of the resin substrate layer 10 by irradiating with laser light from the glass substrate side of the resin substrate layer 10, and a protective sheet (not illustrated) is attached to the lower face of the resin substrate layer 10 from which the glass substrate has been peeled off.

Thus, the organic EL display device 50*a* of the present embodiment can be manufactured as described above.

Note that in the present embodiment, the organic EL display device 50*a* including the TFT layer 30*a* is exemplified, but organic EL display devices including thin film transistor layers 30*aa*, 30*ab*, and 30*ac*, respectively, as illustrated below may be used. Here, FIG. 9, FIG. 10, and FIG. 11 are cross-sectional views illustrating the thin film transistor layers 30*aa*, 30*ab*, and 30*ac* of first, second, and third modified examples of the thin film transistor layer 30*a*, respectively.

Figure 9:
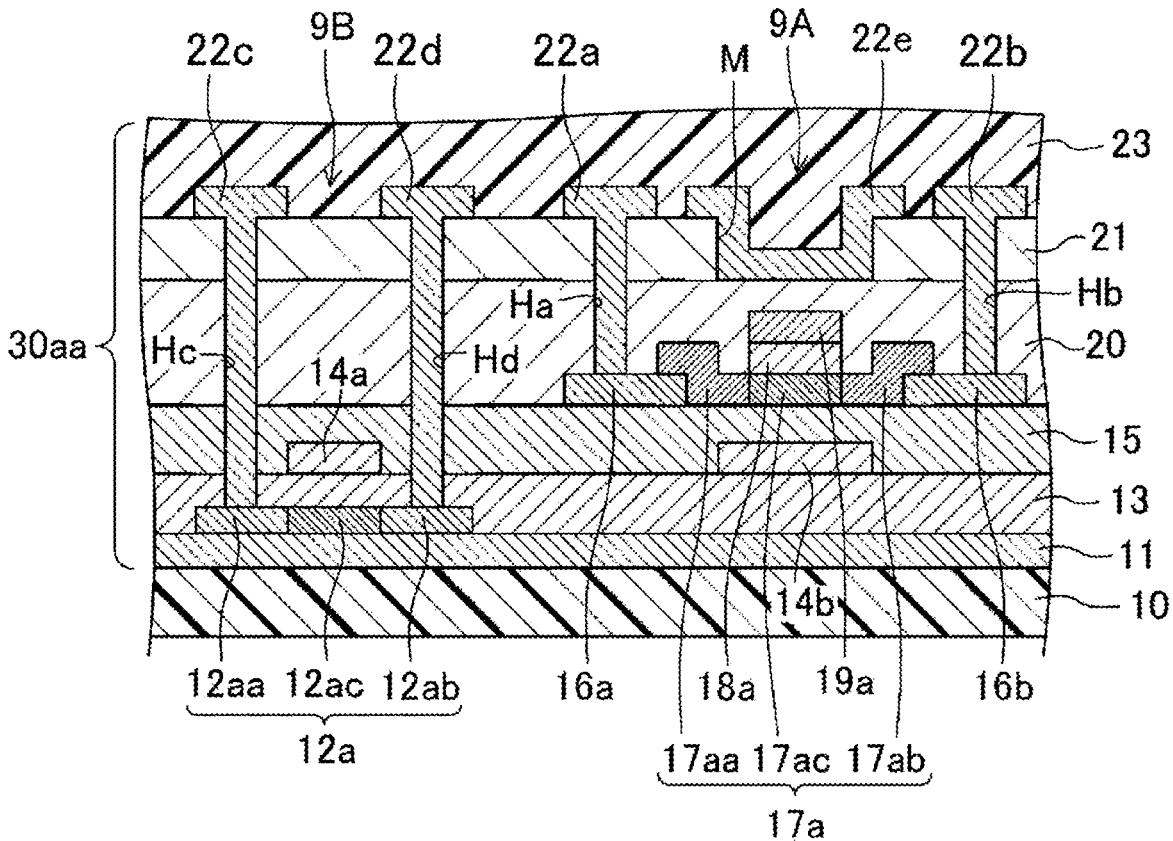
FIG. 9 is a cross-sectional view illustrating a first modified example of the thin film transistor layer included in the organic EL display device according to the first embodiment of the disclosure.

In the TFT layer 30*aa*, as illustrated in FIG. 9, a lower gate electrode 14*b* is provided closer to the resin substrate layer 10 than the first semiconductor layer 17*a* with the third interlayer insulating film 15 interposed therebetween in the first TFT 9A. Here, the lower gate electrode 14*b* is configured to control conduction between the first conductor region 17*aa* and the second conductor region 17*ab* of the first semiconductor layer 17*a*, similar to the first gate electrode 19*a*. The lower gate electrode 14*b* is formed of the same material and in the same layer as the second gate electrode 14*a*. According to the TFT layer 30*aa*, since the first TFT 9A has a double gate structure, drive capability of the first TFT 9A can be enhanced, and since potential of a lower interface of the first semiconductor layer 17*a* is fixed, characteristics of the first TFT 9A can be stabilized and reliability of the first TFT 9A can be enhanced.

Figure 10:
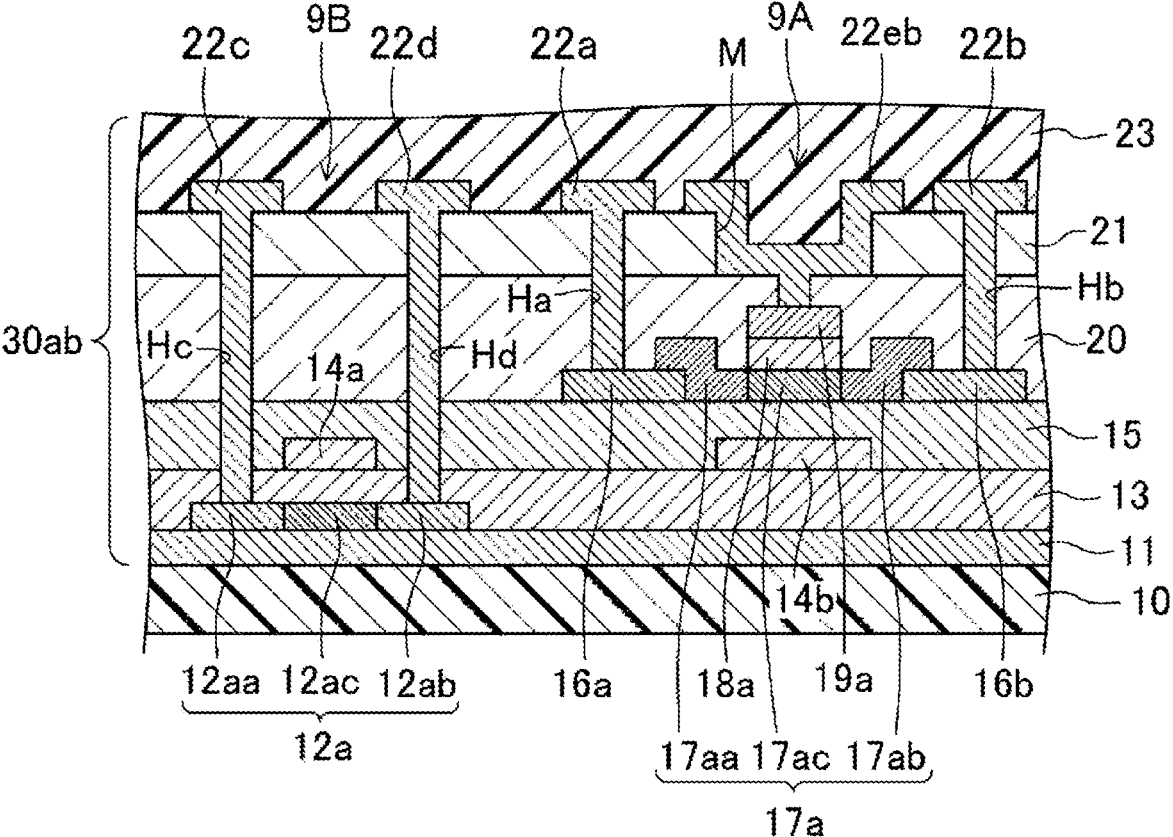
FIG. 10 is a cross-sectional view illustrating a second modified example of the thin film transistor layer included in the organic EL display device according to the first embodiment of the disclosure.

In the TFT layer 30*ab*, as illustrated in FIG. 10, the lower gate electrode 14*b* is provided in the first TFT 9A, as in the TFT layer 30*aa*, and a metal coating layer 22*eb* corresponding to the metal coating layer 22*e* is electrically connected to the first gate electrode 19*a*. According to the TFT layer 30*ab*, since the metal coating layer 22*eb* is electrically connected to the first gate electrode 19*a*, formation of parasitic capacitance caused by the metal coating layer 22*eb* can be suppressed.

Figure 11:
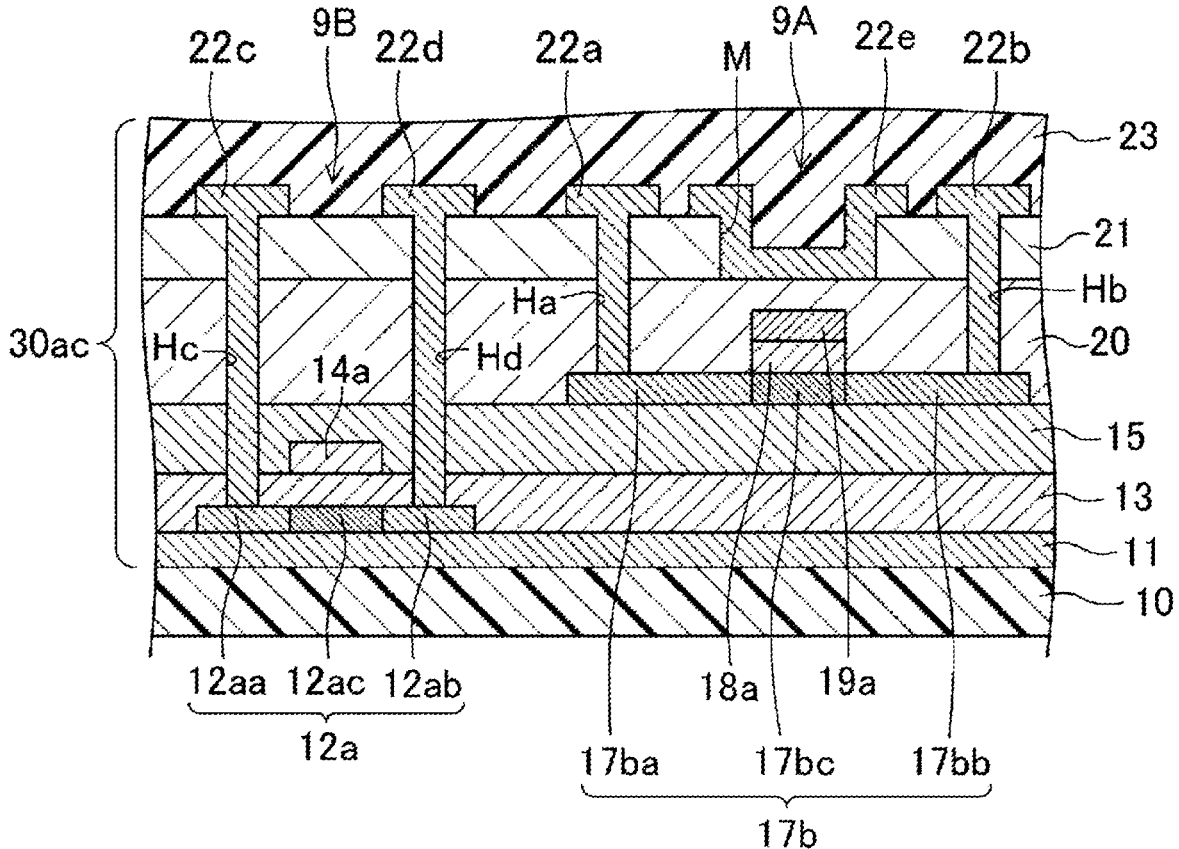
FIG. 11 is a cross-sectional view illustrating a third modified example of the thin film transistor layer included in the organic EL display device according to the first embodiment of the disclosure.

In the TFT layer 30*ac*, as illustrated in FIG. 11, the first contact hole Ha and the second contact hole Hb are provided so as to overlap a first conductor region 17*ba* and a second conductor region 17*bb*, which will be described later, in the first TFT 9A, respectively, thereby forming a top contact structure. Here, a first semiconductor layer 17*b* corresponding to the first semiconductor layer 17*a* includes the first conductor region 17*ba* and the second conductor region 17*bb* defined to be separated from each other, and a first channel region 17*bc* defined between the first conductor region 17*ba* and the second conductor region 17*bb*. According to the TFT layer 30*ac*, the first conductive layer 16*a* and the second conductive layer 16*b* in the TFT layer 30*a* can be omitted, so that a manufacturing process can be simplified.

As described above, according to the organic EL display device 50*a* of the present embodiment, in the second interlayer insulating film 21, which is the silicon nitride film, the through-hole M is formed through the second interlayer insulating film 21 so as to overlap all of the first channel region 17*ac* of the first semiconductor layer 17*a*, so that diffusion of hydrogen from the silicon nitride film used as the second interlayer insulating film 21 to the first channel region 17*ac* can be suppressed. In addition, the metal coating layer 22*e* having a moisture-proof property is integrally provided on the surface of the first interlayer insulating film 20 exposed from the through-hole M where the second interlayer insulating film 21 having a moisture-proof property does not exist and the surface of the peripheral portion of the through-hole M, which can suppress diffusion of moisture from the flattening film 23 to the first channel region 17*ac*. Thus, in the first TFT 9A, diffusion of moisture and hydrogen into the first channel region 17*ac* of the first semiconductor layer 17*a* is suppressed, so that a depletion shift due to the diffusion of moisture and hydrogen can be suppressed. Furthermore, by suppressing the depletion shift due to the diffusion of moisture and hydrogen, a decrease in manufacturing yield and reliability of the organic EL display device 50*a* can be suppressed.

Second Embodiment

Figure 12:
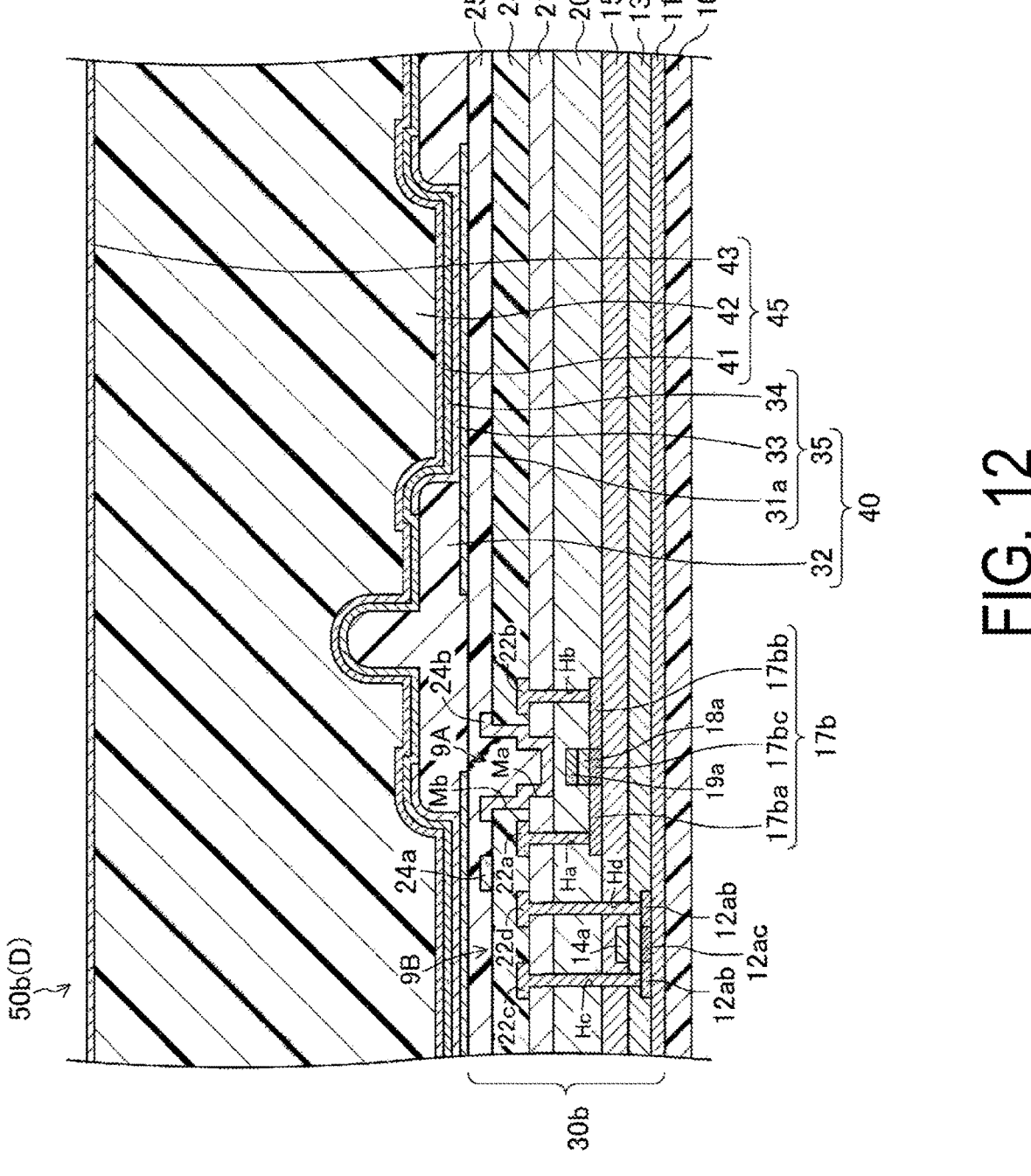
FIG. 12 is a cross-sectional view of a display region of an organic EL display device according to a second embodiment of the disclosure.
Figure 13:
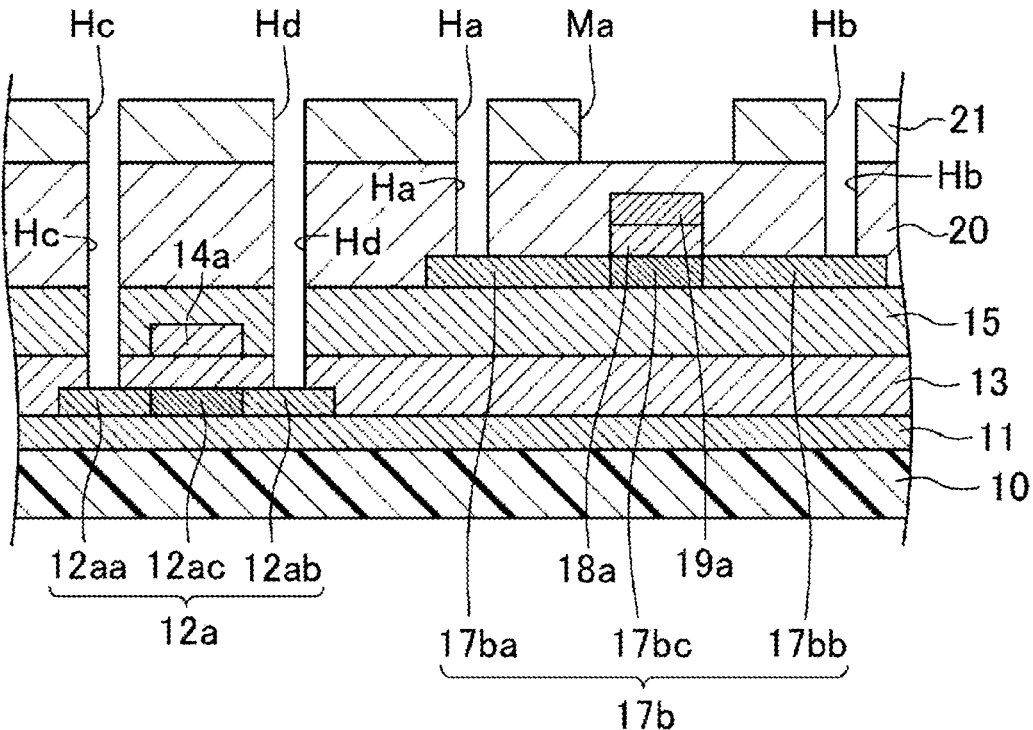
FIG. 13 is a first cross-sectional view illustrating a method for manufacturing the organic EL display device according to the second embodiment of the disclosure.
Figure 14:
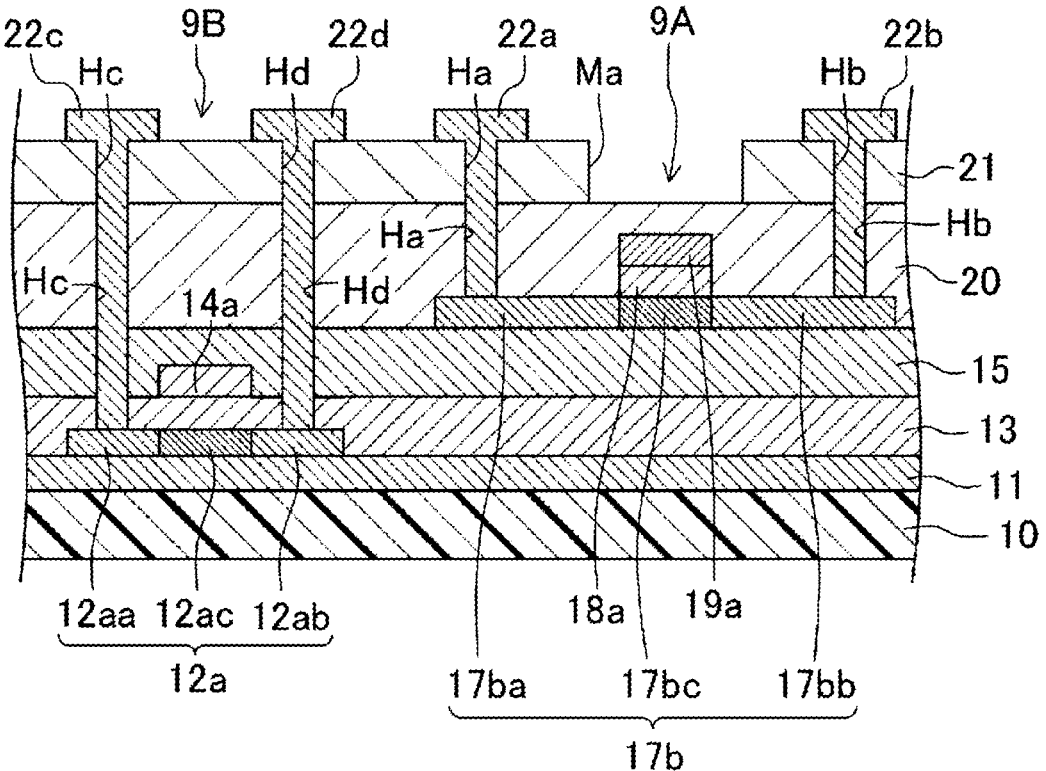
FIG. 14 is a second cross-sectional view illustrating the method for manufacturing the organic EL display device according to the second embodiment of the disclosure.
Figure 15:
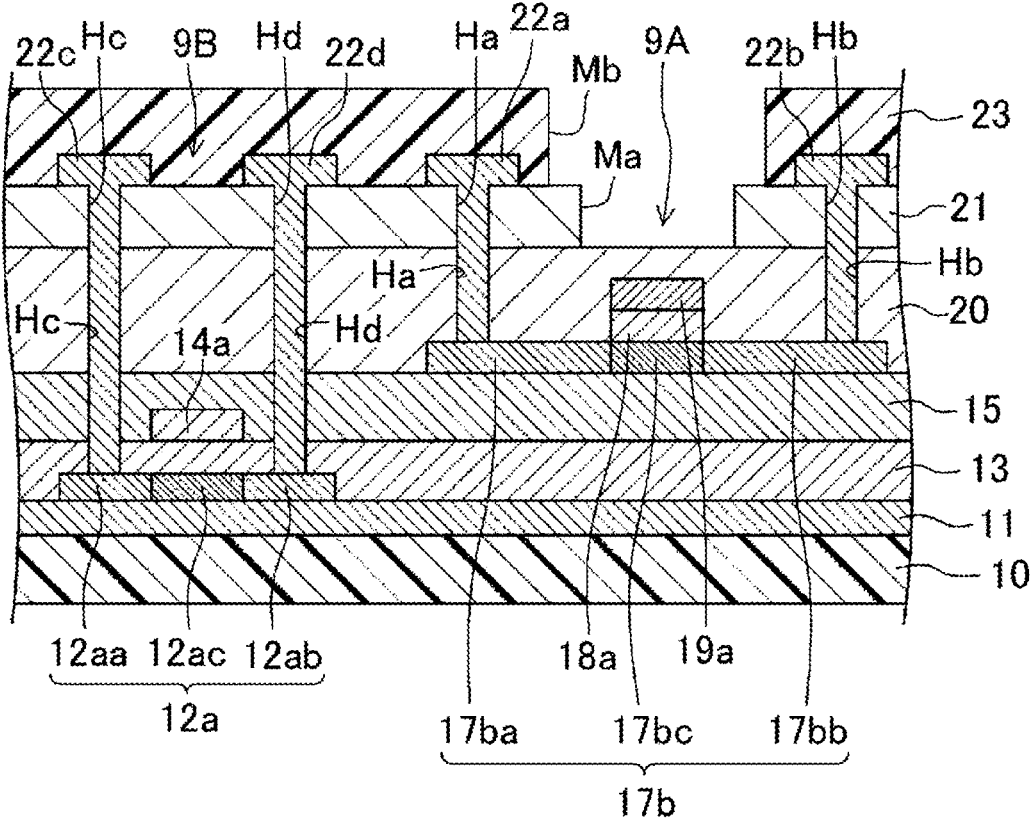
FIG. 15 is a third cross-sectional view illustrating the method for manufacturing the organic EL display device according to the second embodiment of the disclosure.

FIG. 12 to FIG. 15 illustrate a second embodiment of a display device according to the disclosure. Here, FIG. 12 is a cross-sectional view of a display region D of an organic EL display device 50*b* of the present embodiment. FIG. 13, FIG. 14, and FIG. 15 are first, second, and third cross-sectional views illustrating a method for manufacturing the organic EL display device 50*b*. Note that in the following embodiments, the same parts as those in FIG. 1 to FIG. 11 are denoted by the same reference signs, and detailed description thereof will be omitted.

In the first embodiment described above, the organic EL display device 50*a* is exemplified in which the metal coating layer 22*e* is provided of the same material and in the same layer as the first terminal electrode 22a and the like, but in the present embodiment, the organic EL display device 50b is exemplified in which a metal coating layer 24b is provided of the same material and in the same layer as a power source line 24a.

As with the organic EL display device 50a of the first embodiment described above, the organic EL display device 50b includes, for example, the display region D provided in a rectangular shape and a frame region F provided in a periphery of the display region D.

As illustrated in FIG. 12, the organic EL display device 50b includes a resin substrate layer 10, a TFT layer 30b provided on the resin substrate layer 10, an organic EL element layer 40 provided on the TFT layer 30b, and a sealing film 45 provided to cover the organic EL element layer 40.

As illustrated in FIG. 12, the TFT layer 30b includes a base coat film 11 provided on the resin substrate layer 10, three first TFTs 9A, four second TFTs 9B, and one capacitor 9h (see FIG. 4) provided on the base coat film 11 for each subpixel P, and a first flattening film 23 and a second flattening film 25 sequentially provided on all of the first TFTs 9A, the second TFTs 9B, and the capacitors 9h. Here, similar to the TFT layer 30a of the first embodiment described above, the TFT layer 30b is provided with a plurality of gate lines 14g, a plurality of light emission control lines 14e, a plurality of source lines 22f, and a plurality of initialization signal lines 22i. In addition, in the TFT layer 30b, instead of the power source lines 22g in the TFT layer 30a of the first embodiment, as illustrated in FIG. 12, the power source line 24a is provided in a lattice pattern as a wiring line layer between the first flattening film 23 and the second flattening film 25. Here, as illustrated in FIG. 12, in the TFT layer 30b, the base coat film 11, a second gate insulating film 13, a third interlayer insulating film 15, a first interlayer insulating film 20, a second interlayer insulating film 21, the first flattening film 23, and the second flattening film 25 are sequentially layered on the resin substrate layer 10.

As illustrated in FIG. 12, the first TFT 9A includes a first semiconductor layer 17b provided on the third interlayer insulating film 15, a first gate insulating film 18a provided on a first channel region 17bc of the first semiconductor layer 17b, a first gate electrode 19a provided on the first gate insulating film 18a, the first interlayer insulating film 20 provided to cover the first gate electrode 19a, the second interlayer insulating film 21 provided on the first interlayer insulating film 20, and a first terminal electrode 22a and a second terminal electrode 22b provided on the second interlayer insulating film 21 so as to be separated from each other. Here, at least the third interlayer insulating film 15 and the first gate insulating film 18a on sides of the first semiconductor layer 17b are composed of, for example, silicon oxide films, respectively. Although the first TFT 9A having a single gate structure is exemplified in the present embodiment, the first TFT 9A may have a double gate structure as in the first modified example of the first embodiment. Although the first TFT 9A having a top contact structure is exemplified in the present embodiment, the first TFT 9A may have a bottom contact structure as in the first embodiment.

As illustrated in FIG. 12, the second interlayer insulating film 21 is provided with a first through-hole Ma passing through the second interlayer insulating film 21 so as to overlap all of the first channel region 17bc.

The first flattening film 23 has a flat surface in the display region D, and is made of, for example, an organic resin material such as a polyimide resin or an acrylic resin, or a polysiloxane-based SOG material. Here, as illustrated in FIG. 12, the first flattening film 23 is provided with a second through-hole Mb passing through the first flattening film 23 so as to overlap all of the first channel region 17bc. Note that, as illustrated in FIG. 12, a periphery of the second through-hole Mb is located outside a periphery of the first through-hole Ma. As illustrated in FIG. 12, the metal coating layer 24b is integrally provided on a surface of the first interlayer insulating film 20 exposed from the first through-hole Ma, a surface of the peripheral portion of the first through-hole Ma, and a surface of the peripheral portion of the second through-hole Mb. Here, the metal coating layer 24b is formed of the same material and in the same layer as the power source line 24a. Further, the metal coating layer 24b is electrically floating. Note that the metal coating layer 24b may be electrically connected to the first gate electrode 19a as in the second modified example of the first embodiment.

The second flattening film 25 has a flat surface in the display region D, and is made of, for example, an organic resin material such as a polyimide resin or an acrylic resin, or a polysiloxane-based SOG material. As illustrated in FIG. 12, the second flattening film 25 is provided so as to cover the power source line 24a and the metal coating layer 24b provided on the first flattening film 23.

In the organic EL display device 50b having the configuration described above, similar to the organic EL display device 50a of the first embodiment described above, in each subpixel P, the organic EL element 35 emits light at luminance corresponding to a drive current to perform the image display.

Next, a method for manufacturing the organic EL display device 50b according to the present embodiment will be described. Note that the method for manufacturing the organic EL display device 50b includes a TFT layer forming step, an organic EL element layer forming step, and a sealing film forming step.

TFT Layer Forming Step

First, in the TFT layer forming step in the method for manufacturing the organic EL display device 50a of the first embodiment described above, an oxide semiconductor film such as InGaZnO$_4$ (having a thickness of about 30 nm) is formed on a surface of the substrate on which the third interlayer insulating film 15 is formed, for example, by sputtering, and subsequently, the oxide semiconductor film is patterned to form the first semiconductor layers 17b and the like.

Subsequently, on the substrate surface on which the first semiconductor layers 17b and the like are formed, a silicon oxide film (having a thickness of about 100 nm) and the like are formed by, for example, plasma CVD, and then a metal film such as a single-layer film that is a molybdenum film (having a thickness of about 200 nm), a layered film in which an aluminum film (having a thickness of about 300 nm) and a titanium film (having a thickness of about 50 nm) are sequentially layered, or a layered film in which a titanium film (having a thickness of about 50 nm), an aluminum film (having a thickness of about 300 nm), and a titanium film (having a thickness of about 50 nm) are sequentially layered is formed by sputtering. Then, by patterning a layered film thereof, the first gate insulating films 18a, the first gate electrodes 19a, and the like are formed.

Further, on the substrate surface on which the first gate electrodes 19a and the like are formed, a silicon oxide film (having a thickness of about 400 nm) and a silicon nitride film (having a thickness of about 200 nm) are sequentially formed, by, for example, plasma CVD, thereby forming the first interlayer insulating film 20 and the second interlayer insulating film 21.

Thereafter, similar to the TFT layer forming step in the first embodiment, by appropriately patterning the second gate insulating film 13, the third interlayer insulating film 15, the first interlayer insulating film 20, and the second interlayer insulating film 21, first contact holes Ha, second contact holes Hb, third contact holes Hc, fourth contact holes Hd, the first through-holes Ma, and the like are formed (see FIG. 13).

Subsequently, on the surface of the substrate in which the first through-holes Ma and the like are formed in the second interlayer insulating film 21, a titanium film (having a thickness of about 50 nm), an aluminum film (having a thickness of about 600 nm), a titanium film (having a thickness of about 50 nm), and the like are sequentially formed by, for example, sputtering, and then, a metal layered film thereof is patterned to form the first terminal electrodes 22a, the second terminal electrodes 22b, the third terminal electrodes 22c, the fourth terminal electrodes 22d, the source lines 22f, the initialization signal lines 22i, and the like, as illustrated in FIG. 14.

Further, a polyimide-based photosensitive resin film (having a thickness of about 2 μm) is applied to the substrate surface on which the first terminal electrodes 22a and the like are formed by, for example, spin coating or slit coating, and then pre-baking, exposing, developing, and post-baking are performed on the applied film to form the first flattening film 23 having the second through-holes Mb as illustrated in FIG. 15.

Thereafter, a titanium film (having a thickness of about 50 nm), an aluminum film (having a thickness of about 600 nm), a titanium film (having a thickness of about 50 nm), and the like are sequentially formed on the substrate surface on which the first flattening film 23 is formed, for example, by sputtering, and then, a metal layered film thereof is patterned to form the power source line 24a, the metal coating layers 24b, and the like.

Finally, a polyimide-based photosensitive resin film (having a thickness of about 2 μm) is applied by, for example, spin coating or slit coating to the substrate surface on which the power source line 24a and the like are formed, and subsequently pre-baking, exposing, developing, and post-baking are performed on the applied film to form the second flattening film 25.

As described above, the TFT layer 30b can be formed. Thereafter, the organic EL element layer forming step and the sealing film forming step are performed in the same manner as in the method for manufacturing the organic EL display device 50a of the first embodiment, whereby the organic EL display device 50b of the present embodiment can be manufactured.

As described above, according to the organic EL display device 50b of the present embodiment, in the second interlayer insulating film 21, which is the silicon nitride film, the first through-hole Ma is formed through the second interlayer insulating film 21 so as to overlap all of the first channel region 17bc of the first semiconductor layer 17b, so that diffusion of hydrogen from the silicon nitride film used as the second interlayer insulating film 21 to the first channel region 17bc can be suppressed. In addition, the metal coating layer 24b having a moisture-proof property is integrally provided on a surface of the first interlayer insulating film 20 exposed from the first through-hole Ma where the second interlayer insulating film 21 having a moisture-proof property does not exist, a surface of the peripheral portion of the first through-hole Ma, and a surface of the peripheral portion of the second through-hole Mb, which can suppress diffusion of moisture from the second flattening film 25 to the first channel region 17bc. Thus, in the first TFT 9A, diffusion of moisture and hydrogen into the first channel region 17bc of the first semiconductor layer 17b is suppressed, so that a depletion shift due to the diffusion of moisture and hydrogen can be suppressed. Furthermore, by suppressing the depletion shift due to the diffusion of moisture and hydrogen, a decrease in manufacturing yield and reliability of the organic EL display device 50b can be suppressed.

Third Embodiment

Figure 16:
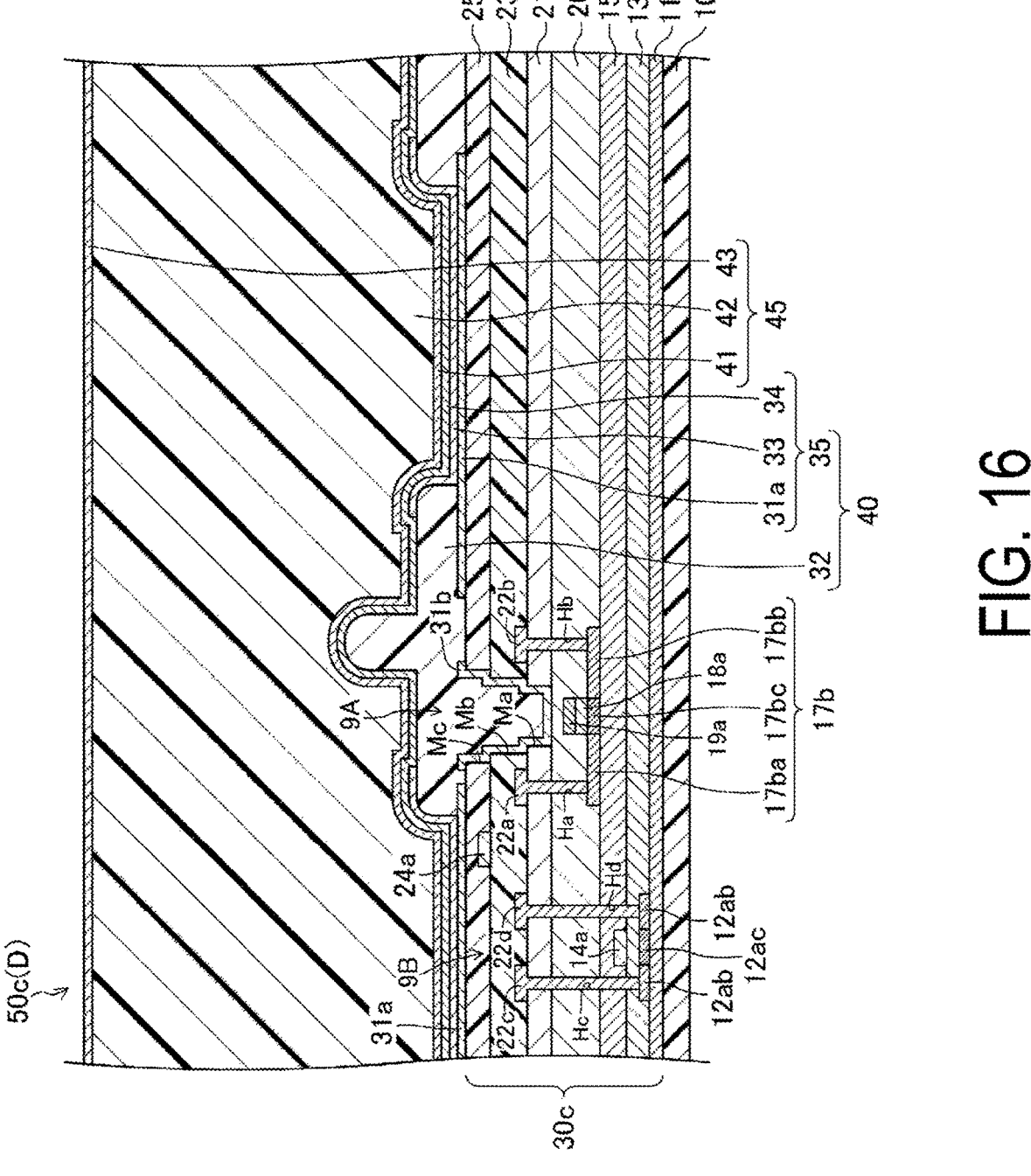
FIG. 16 is a cross-sectional view of a display region of an organic EL display device according to a third embodiment of the disclosure.
Figure 17:
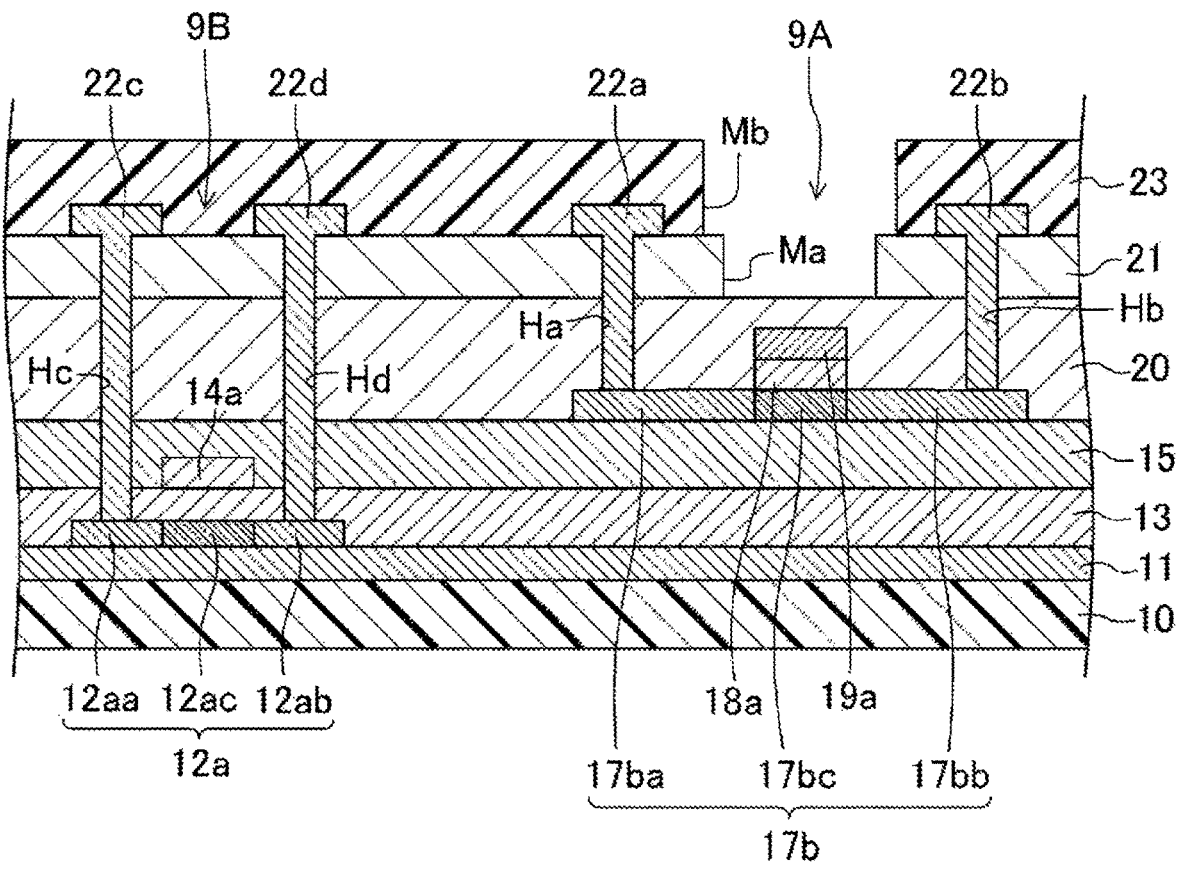
FIG. 17 is a first cross-sectional view illustrating a method for manufacturing the organic EL display device according to the third embodiment of the disclosure.
Figure 18:
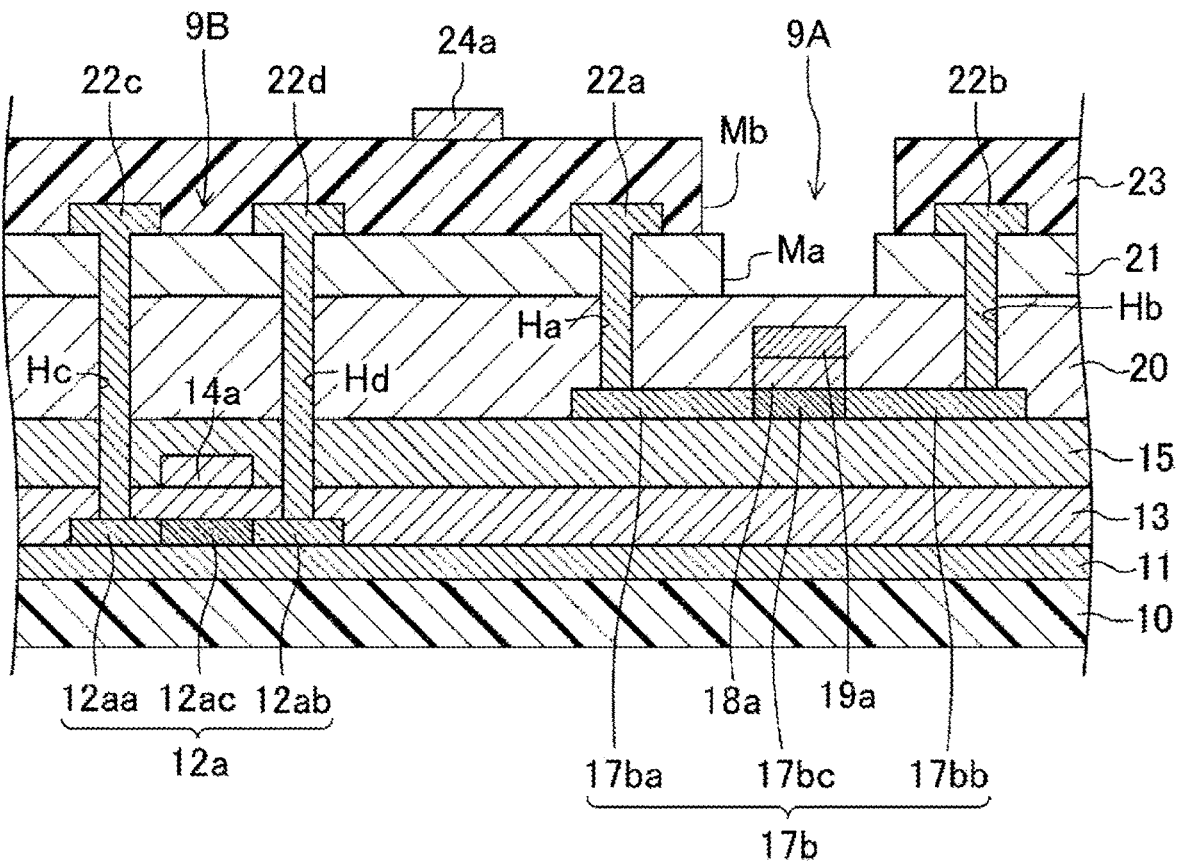
FIG. 18 is a second cross-sectional view illustrating the method for manufacturing the organic EL display device according to the third embodiment of the disclosure.
Figure 19:
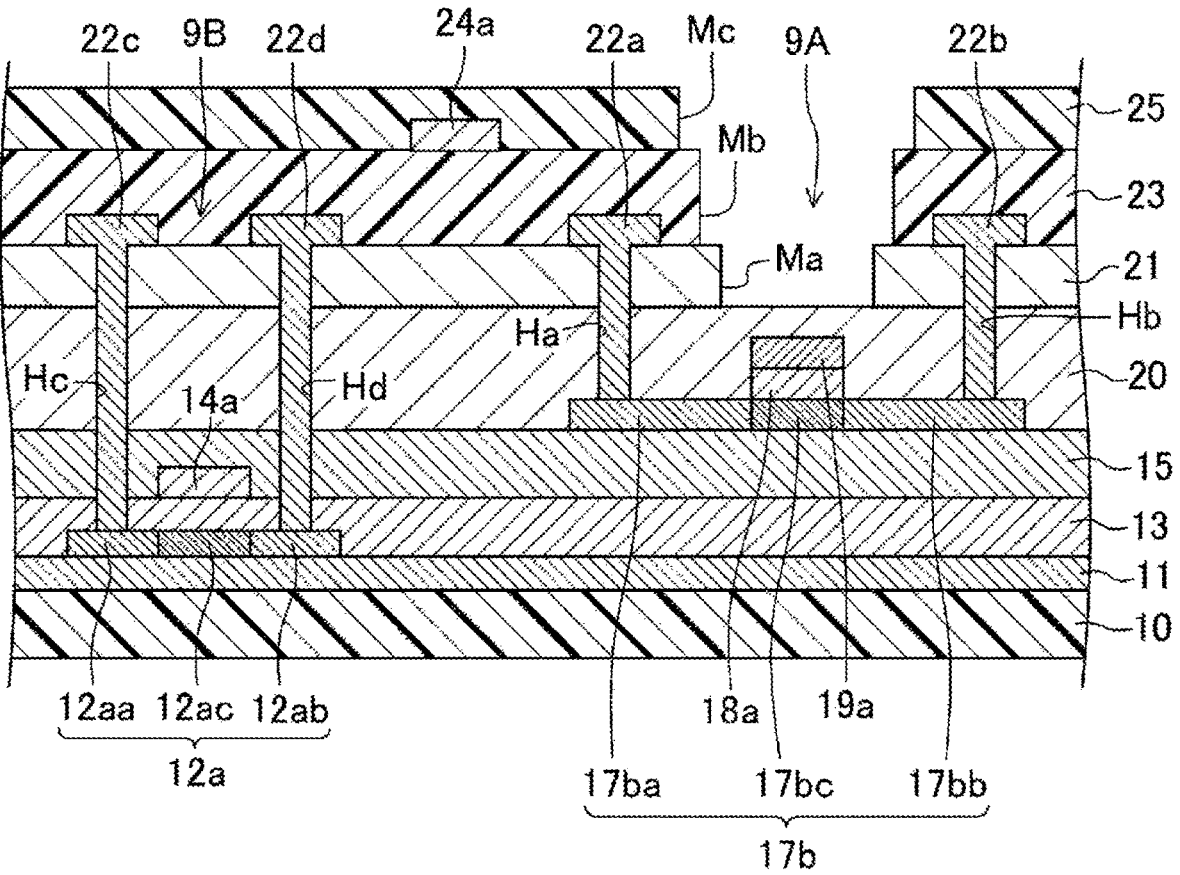
FIG. 19 is a third cross-sectional view illustrating the method for manufacturing the organic EL display device according to the third embodiment of the disclosure.

FIG. 16 to FIG. 19 illustrate a third embodiment of a display device according to the disclosure. FIG. 16 is a sectional view of a display region D of an organic EL display device 50c of the present embodiment. FIG. 17, FIG. 18, and FIG. 19 are first, second, and third cross-sectional views illustrating a method for manufacturing the organic EL display device 50c.

In the first embodiment described above, the organic EL display device 50a is exemplified in which the metal coating layer 22e is provided of the same material and in the same layer as the first terminal electrode 22a and the like, but in the present embodiment, the organic EL display device 50c is exemplified in which a metal coating layer 31b is provided of the same material and in the same layer as a first electrode 31a.

As with the organic EL display device 50a of the first embodiment described above, the organic EL display device 50c includes, for example, the display region D provided in a rectangular shape and a frame region F provided in a periphery of the display region D.

As illustrated in FIG. 16, the organic EL display device 50c includes a resin substrate layer 10, a TFT layer 30c provided on the resin substrate layer 10, an organic EL element layer 40 provided on the TFT layer 30c, and a sealing film 45 provided to cover the organic EL element layer 40.

As illustrated in FIG. 16, the TFT layer 30c includes a base coat film 11 provided on the resin substrate layer 10, three first TFTs 9A, four second TFTs 9B, and one capacitor 9h (see FIG. 4) provided on the base coat film 11 for each subpixel P, and a first flattening film 23 and a second flattening film 25 sequentially provided on all of the first TFTs 9A, the second TFTs 9B, and the capacitors 9h. Here, similar to the TFT layer 30a of the first embodiment described above, the TFT layer 30c is provided with a plurality of gate lines 14g, a plurality of light emission control lines 14e, a plurality of source lines 22f, and a plurality of initialization signal lines 22i. In addition, in the TFT layer 30c, instead of the power source lines 22g in the TFT layer 30a of the first embodiment, as illustrated in FIG. 16, a power source line 24a is provided in a lattice pattern as a wiring line layer between the first flattening film 23 and the second flattening film 25. Here, as illustrated in FIG. 16, in the TFT layer 30c, the base coat film 11, a second gate insulating film 13, a third interlayer insulating film 15, a first interlayer insulating film 20, a second interlayer insulating film 21, the first flattening film 23, and the second flattening film 25 are sequentially layered on the resin substrate layer 10.

As in the second embodiment described above, as illustrated in FIG. 16, the first TFT 9A includes a first semiconductor layer 17b provided on the third interlayer insulating film 15, a first gate insulating film 18a provided on a first channel region 17bc of the first semiconductor layer 17b, a first gate electrode 19a provided on the first gate insulating film 18a, the first interlayer insulating film 20 provided to cover the first gate electrode 19a, the second interlayer insulating film 21 provided on the first interlayer insulating film 20, and a first terminal electrode 22a and a second terminal electrode 22b provided on the second interlayer insulating film 21 so as to be separated from each other. Although the first TFT 9A having a single gate structure is exemplified in the present embodiment, the first TFT 9A may have a double gate structure as in the first modified example of the first embodiment. Although the first TFT 9A having a top contact structure is exemplified in the present embodiment, the first TFT 9A may have a bottom contact structure as in the first embodiment.

As illustrated in FIG. 16, the second interlayer insulating film 21 is provided with a first through-hole Ma passing through the second interlayer insulating film 21 so as to overlap all of the first channel region 17bc.

The first flattening film 23 has a flat surface in the display region D, and is made of, for example, an organic resin material such as a polyimide resin or an acrylic resin, or a polysiloxane-based SOG material. Here, as illustrated in FIG. 16, the first flattening film 23 is provided with a second through-hole Mb passing through the first flattening film 23 so as to overlap all of the first channel region 17bc. Note that, as illustrated in FIG. 16, a periphery of the second through-hole Mb is located outside a periphery of the first through-hole Ma.

The second flattening film 25 has a flat surface in the display region D, and is made of, for example, an organic resin material such as a polyimide resin or an acrylic resin, or a polysiloxane-based SOG material. Here, as illustrated in FIG. 16, the second flattening film 25 is provided with a third through-hole Mc passing through the second flattening film 25 so as to overlap all of the first channel region 17bc. As illustrated in FIG. 16, a periphery of the third through-hole Mc is located outside the periphery of the second through-hole Mb. As illustrated in FIG. 16, the metal coating layer 31b is integrally provided on a surface of the first interlayer insulating film 20 exposed from the first through-hole Ma, a surface of the peripheral portion of the first through-hole Ma, a surface of the peripheral portion of the second through-hole Mb, and a surface of the peripheral portion of the third through-hole Mc. Here, the metal coating layer 31b is formed of the same material and in the same layer as the first electrode 31a. Further, the metal coating layer 31b is electrically floating. Note that the metal coating layer 31b may be electrically connected to the first gate electrode 19a as in the second modified example of the first embodiment.

In the organic EL display device 50c having the configuration described above, similar to the organic EL display device 50a of the first embodiment described above, in each subpixel P, the organic EL element 35 emits light at luminance corresponding to a drive current to perform the image display.

Next, a method for manufacturing the organic EL display device 50c according to the present embodiment will be described. Note that the method for manufacturing the organic EL display device 50c includes a TFT layer forming step, an organic EL element layer forming step, and a sealing film forming step.

TFT Layer Forming Step

First, as in the TFT layer forming step in the method for manufacturing the organic EL display device 50b of the second embodiment described above, the first flattening film 23 having the second through-holes Mb is formed (see FIG. 17).

Subsequently, a titanium film (having a thickness of about 50 nm), an aluminum film (having a thickness of about 600 nm), a titanium film (having a thickness of about 50 nm), and the like are sequentially formed on a substrate surface on which the first flattening film 23 is formed, for example, by sputtering, and then, a metal layered film thereof is patterned to form the power source line 24a and the like as illustrated in FIG. 18.

Finally, a polyimide-based photosensitive resin film (having a thickness of about 2 μm) is applied by, for example, spin coating or slit coating to the substrate surface on which the power source line 24a and the like are formed, and subsequently pre-baking, exposing, developing, and post-baking are performed on the applied film to form the second flattening film 25 having the third through-holes Mc as illustrated in FIG. 19.

As described above, the TFT layer 30c can be formed. Thereafter, in the organic EL element layer forming step in the method for manufacturing the organic EL display device 50a of the first embodiment, the metal coating layers 31b are formed when the first electrodes 31a are formed, and the sealing film forming step in the method for manufacturing the organic EL display device 50a of the first embodiment is performed, whereby the organic EL display device 50c of the present embodiment can be manufactured.

As described above, according to the organic EL display device 50c of the present embodiment, in the second interlayer insulating film 21, which is the silicon nitride film, the first through-hole Ma is formed through the second interlayer insulating film 21 so as to overlap all of the first channel region 17bc of the first semiconductor layer 17b, so that diffusion of hydrogen from the silicon nitride film used as the second interlayer insulating film 21 to the first channel region 17bc can be suppressed. In addition, the metal coating layer 31b having a moisture-proof property is integrally provided on a surface of the first interlayer insulating film 20 exposed from the first through-hole Ma where the second interlayer insulating film 21 having a moisture-proof property does not exist, a surface of the peripheral portion of the first through-hole Ma, a surface of the peripheral portion of the second through-hole Mb, and a surface of the peripheral portion of the third through-hole Mc, which can suppress diffusion of moisture from an edge cover 32 to the first channel region 17bc. Thus, in the first TFT 9A, diffusion of moisture and hydrogen into the first channel region 17bc of the first semiconductor layer 17b is suppressed, so that a depletion shift due to the diffusion of moisture and hydrogen can be suppressed. Furthermore, by suppressing the depletion shift due to the diffusion of moisture and hydrogen, a decrease in manufacturing yield and reliability of the organic EL display device 50c can be suppressed.

OTHER EMBODIMENTS

In each of the above-described embodiments, the organic EL display device having a hybrid structure in which the TFTs having the semiconductor layer made of the polysilicon and the TFTs having the semiconductor layer made of the oxide semiconductor are provided in the subpixel is exemplified. However, the disclosure can also be applied to an organic EL display device in which a subpixel is not provided with TFTs having a semiconductor layer made of polysilicon but is provided with TFTs having a semiconductor layer made of an oxide semiconductor.

In each of the embodiments described above, the organic EL layer of the five-layer structure including the hole injection layer, the hole transport layer, the light-emitting layer, the electron transport layer, and the electron injection layer is exemplified. The organic EL layer may have, for example, a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device is exemplified as a display device. The disclosure can also be applied to a display device including a plurality of light-emitting elements driven by a current, for example, to a display device including quantum dot light-emitting diodes (QLEDs), which are a light-emitting element using a quantum dot-containing layer.

INDUSTRIAL APPLICABILITY

As described above, the disclosure is useful for a flexible display device.

The invention claimed is:

1. A display device comprising:
a base substrate layer; and
a thin film transistor layer provided on the base substrate layer,
wherein a first thin film transistor including a first semiconductor layer formed of an oxide semiconductor is provided for a subpixel in the thin film transistor layer,
the first thin film transistor includes
the first semiconductor layer including a first conductor region and a second conductor region defined separately from each other and a first channel region defined between the first conductor region and the second conductor region,
a first gate insulating film provided on the first semiconductor layer,
a first gate electrode provided on the first gate insulating film and configured to control conduction between the first conductor region and the second conductor region,
a first interlayer insulating film being a silicon oxide film and configured to cover the first gate electrode,
a second interlayer insulating film being a silicon nitride film provided on the first interlayer insulating film, and
a first terminal electrode and a second terminal electrode provided on the second interlayer insulating film separated from each other and electrically connected to the first conductor region and the second conductor region through a first contact hole and a second contact hole, respectively, formed in the first interlayer insulating film and the second interlayer insulating film,
the second interlayer insulating film is formed with a through-hole passing through the second interlayer insulating film and overlapping all of the first channel region, and a metal coating layer is integrally provided on a surface of the first interlayer insulating film exposed from the through-hole and a surface of a peripheral portion of the through-hole.

2. The display device according to claim 1,
wherein the metal coating layer is formed of the same material and in the same layer as the first terminal electrode and the second terminal electrode.

3. The display device according to claim 1,
wherein the thin film transistor layer includes
a first flattening film configured to cover the first terminal electrode and the second terminal electrode,
a wiring line layer provided on the first flattening film, and
a second flattening film configured to cover the wiring line layer, and
the metal coating layer is formed of the same material and in the same layer as the wiring line layer.

4. The display device according to claim 1, comprising:
a light-emitting element layer provided on the thin film transistor layer and sequentially including a plurality of first electrodes and a plurality of light-emitting function layers corresponding to a plurality of the subpixels, and a second electrode common to the plurality of subpixels; and
a sealing film configured to cover the light-emitting element layer,
wherein the metal coating layer is formed of the same material and in the same layer as each of the plurality of first electrodes.

5. The display device according to claim 1,
wherein the metal coating layer is electrically connected to the first gate electrode.

6. The display device according to claim 1,
wherein the metal coating layer is electrically floating.

7. The display device according to claim 1,
wherein a lower gate electrode configured to control conduction between the first conductor region and the second conductor region is provided closer to the base substrate layer than the first channel region, with a third interlayer insulating film interposed between the first channel region and the lower gate electrode.

8. The display device according to claim 1,
wherein a first conductive layer and a second conductive layer are in contact with the first conductor region and the second conductor region, respectively, on a side of the base substrate layer of the first conductor region and the second conductor region, and
the first contact hole and the second contact hole overlap the first conductive layer and the second conductive layer, respectively.

9. The display device according to claim 1,
wherein the first contact hole and the second contact hole overlap the first conductor region and the second conductor region, respectively.

10. The display device according to claim 1,
wherein a second thin film transistor including a second semiconductor layer formed of polysilicon is provided for the subpixel in the thin film transistor layer, in addition to the first thin film transistor,
the second thin film transistor includes
the second semiconductor layer including a third conductor region and a fourth conductor region defined separately from each other,
a second gate insulating film provided on the second semiconductor layer, a second gate electrode provided on the second gate insulating film and configured to control conduction between the third conductor region and the fourth conductor region, a third interlayer insulating film, the first interlayer insulating film, and the second interlayer insulating film provided sequentially configured to cover the second gate electrode, and a third terminal electrode and a fourth terminal electrode provided on the second interlayer insulating film separated from each other, and electrically connected to the third conductor region and the fourth conductor region through a third contact hole and a fourth contact hole, respectively, formed in the second gate insulating film, the third interlayer insulating film, the first interlayer insulating film, and the second interlayer insulating film.

11. The display device according to claim 10, wherein the first semiconductor layer is provided on the third interlayer insulating film.

12. The display device according to claim 4, wherein each of the plurality of light-emitting function layers is an organic electroluminescence layer.

\* \* \* \* \*